United States Patent
Min et al.

(10) Patent No.: US 10,756,421 B2
(45) Date of Patent: Aug. 25, 2020

(54) MATCHING NETWORK SYSTEM AND METHOD COMBINED WITH CIRCULATOR

(71) Applicant: LG Electronics Inc., Seoul (KR)

(72) Inventors: Byungwook Min, Seoul (KR); Jonghyuk Park, Seoul (KR)

(73) Assignee: LG Electronics Inc., Seoul (KR)

( * ) Notice: Subject to any disclaimer, the term of this patent is extended or adjusted under 35 U.S.C. 154(b) by 120 days.

(21) Appl. No.: 16/143,451

(22) Filed: Sep. 26, 2018

(65) Prior Publication Data

US 2019/0109375 A1 Apr. 11, 2019

(30) Foreign Application Priority Data

Jul. 27, 2017 (KR) .................. 10-2017-0095593

(51) Int. Cl.
- *H03H 7/38* (2006.01)
- *H01Q 1/52* (2006.01)
- *H03H 7/40* (2006.01)

(52) U.S. Cl.
CPC ............... *H01Q 1/52* (2013.01); *H03H 7/38* (2013.01); *H03H 7/40* (2013.01)

(58) Field of Classification Search
CPC . H03H 7/38; H03H 7/40; H03H 11/28; H03H 11/30; H01Q 1/52
USPC .................................................. 333/17.3, 32
See application file for complete search history.

(56) References Cited

U.S. PATENT DOCUMENTS

| 2006/0025088 | A1 | 2/2006 | Pietig et al. | |
| 2016/0105272 | A1* | 4/2016 | Griffiths | H04B 1/0458 |
| | | | | 370/278 |
| 2019/0267212 | A1* | 8/2019 | Mavretic | H03K 17/687 |

FOREIGN PATENT DOCUMENTS

| KR | 10-2007-0099294 A | 10/2007 |
| KR | 10-2008-0096176 A | 10/2008 |
| KR | 10-2014-0012511 A | 2/2014 |
| KR | 10-1553008 B1 | 9/2015 |

* cited by examiner

Primary Examiner — Stephen E. Jones
(74) Attorney, Agent, or Firm — Park, Kim & Suh, LLC

(57) ABSTRACT

A matching network system combined with a circulator, and a method thereof are provided. In the matching network system and method, a reflection coefficient per frequency, required to cancel a signal leaked (a leakage signal) from a port combined with an antenna (an antenna port) is calculated, an impedance value is calculated from the calculated reflection coefficient, and any antenna is matched to a matching network by using a matching network circuit for changing an impedance value of the antenna to the calculated impedance value. Therefore, cancellation of the leakage signal is controlled. In this manner, the isolation performance of the circulator in a plurality of frequencies can be increased.

10 Claims, 35 Drawing Sheets

FIG. 26
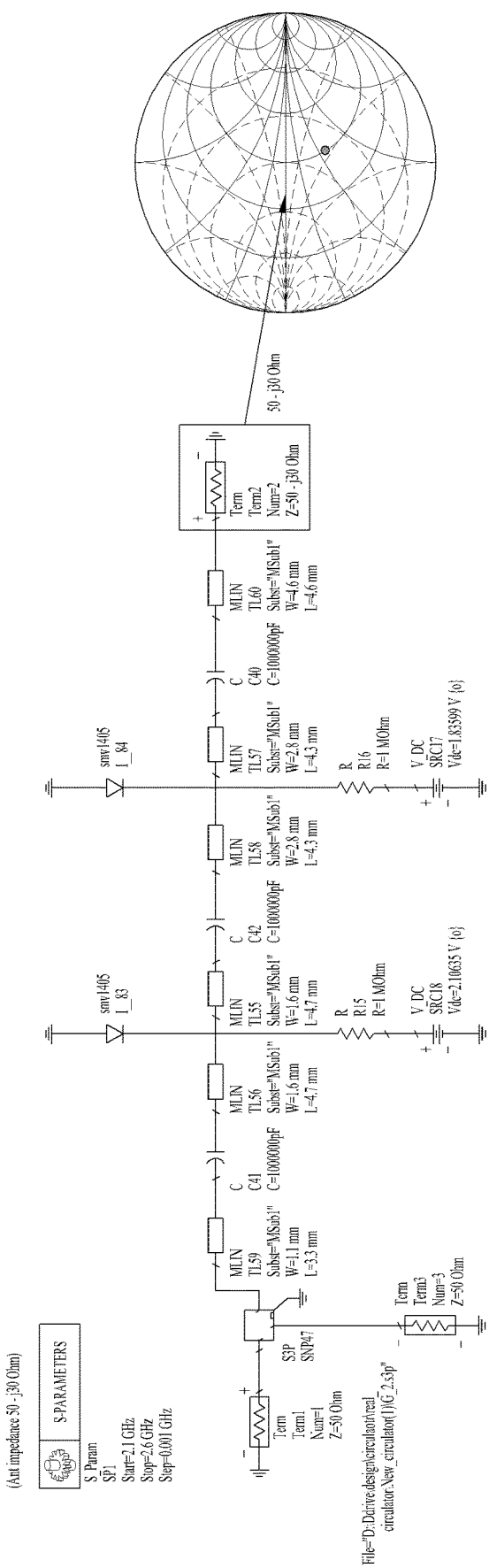
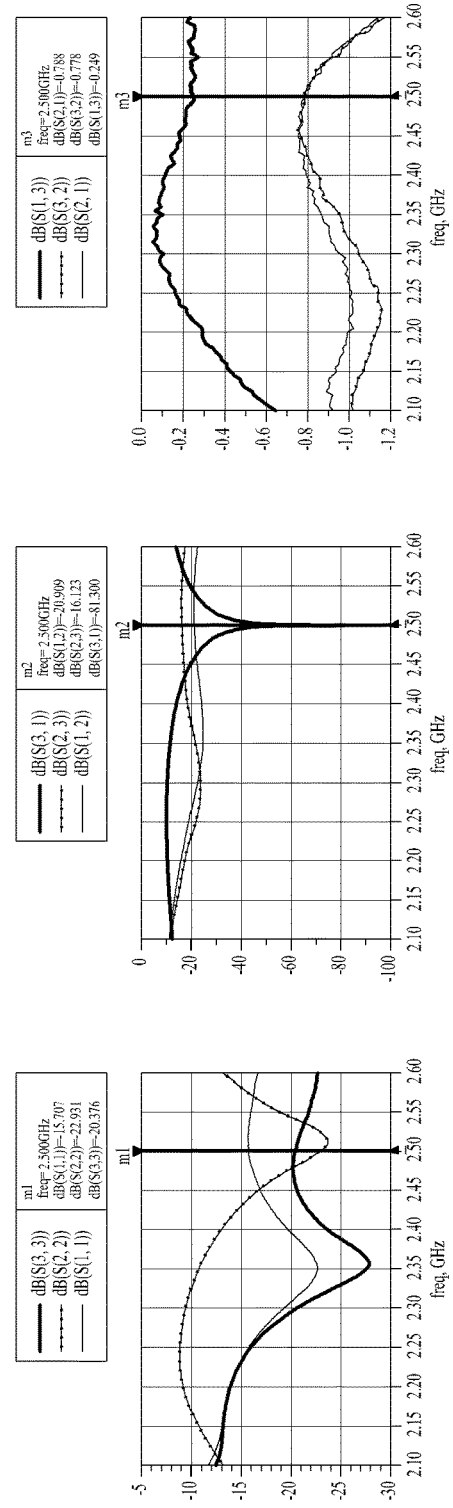

MATCHING NETWORK SYSTEM AND METHOD COMBINED WITH CIRCULATOR

CROSS-REFERENCE TO RELATED APPLICATIONS

This application claims the benefit of the Korean Patent Application No. 10-2017-0095593, filed on Jul. 27, 2017, which is hereby incorporated by reference as if fully set forth herein.

BACKGROUND OF THE DISCLOSURE

Field

The present invention relates to a technique of increasing the isolation performance of a circulator, and more particularly, to a matching network system for increasing the isolation of a circulator in a plurality of frequencies, and a method thereof.

Background

A radio frequency (RF) circulator is a non-reciprocal ferrite device having three ports. Due to the non-reciprocity of the RF circulator, energy entering port 1 exits mainly from port 2, energy entering port 2 exits from port 3, and energy entering port 3 exits from port 1 in the RF circulator. Because the RF circulator is formed of ferrite, it is difficult to integrate the RF circulator with other RF devices. Moreover, the RF circulator is large as an independent device, and expensive. Accordingly, there are limitations in designing a circulator with good performance for an individual system.

FIG. 1 is a view illustrating the structure of a matching network circulator according to an embodiment of the related art. As illustrated in FIG. 1, the circulator is used mainly in a radar and a communication system. The circulator is used to direct a signal flow from a transmitter (port 1) to an antenna (port 2) during transmission, and to direct a signal flow from the antenna (port 2) to a receiver (port 3). However, the circulator is not capable of perfectly isolating port 3 from a signal of port 1. The resulting flow of a strong signal from the transmitter to the receiver adds interference and noise to a desired signal to be received, thereby decreasing reception sensitivity. The conventional circulator has isolation of −20 dB to −15 dB in a specific frequency range of a passive device.

Further, the isolation of the circulator significantly depends on impedance matching of port 2. A signal traveling from port 1 to port 2 is reflected from port 22 due to impedance mismatch of port 2, and thus flows to port 3. Therefore, the isolation between port 1 and port 3 of the circulator is determined by the isolation of port 2. Typically, since the antenna is not designed to have an impedance of 50 ohm, the isolation between the transmitter and the receiver is lower than the isolation of a general circulator.

To increase the isolation of a circulator in the conventional technology, a circulator having isolation of −20 dB should generally be fabricated of a changed ferrite material or in a new structure. Even in the latter case, frequency adjustment is impossible, and thus the fabricated circulator is viable only in a specific frequency. What is worse, it is impossible to compensate for an isolation decrease caused by mismatch of an antenna port in the conventional circulator.

SUMMARY OF THE DISCLOSURE

An aspect of the present invention is to address at least the above-mentioned problems and/or disadvantages and to provide at least the advantages described below. Accordingly, an aspect of the present invention is to increase the isolation performance of a circulator in a plurality of frequencies.

Another aspect of the present invention is to provide a circulator which has high isolation only by using a matching network and a Varactor diode without a complex structure and which is applicable to various communication systems through frequency switching, compared to a conventional scheme in which a ferrite material is changed for a circulator.

Another aspect of the present invention is to provide a circulator which is applicable to a conventional circulator, and which can be fabricated and used easily with low cost by a user.

It will be appreciated by persons skilled in the art that the objects that could be achieved with the present invention are not limited to what has been particularly described hereinabove and the above and other objects that the present invention could achieve will be more clearly understood from the following detailed description.

In one aspect of the present invention, a matching network system includes a reflection coefficient calculator configured to calculate a reflection coefficient per frequency, required to cancel a signal leaked (a leakage signal) from a port combined with an antenna (an antenna port), an impedance calculator configured to calculate an impedance value from the calculated reflection coefficient, and a matching unit configured to match an antenna by using a matching network circuit for changing an impedance value of the antenna to the calculated impedance value, whereby cancellation of the leakage signal is controlled.

The reflection coefficient of the reflection coefficient calculator may include a magnitude value and a phase value of a reflected signal.

The magnitude value of the reflected signal may be calculated by a formula of calculating a magnitude of a reflected wave, expressed as [Equation 1].

The phase value of the reflected signal may be calculated by a formula of calculating a phase of a reflected wave, expressed as [Equation 2].

A voltage may be controlled by using a Varactor diode further included in the matching network circuit so that a magnitude value and a phase value of the reflected signal are satisfied on each frequency.

In another aspect of the present invention, a method of a matching network combined with a circulator includes calculating a reflection coefficient per frequency, required to cancel a signal leaked (a leakage signal) from a port combined with an antenna (an antenna port) by a reflection coefficient calculator, calculating an impedance value from the calculated reflection coefficient by an impedance calculator, and matching an antenna by using a matching network circuit for changing an impedance value of the antenna to the calculated impedance value by a matching unit, whereby cancellation of the leakage signal is controlled.

The reflection coefficient of the reflection coefficient calculator may include a magnitude value and a phase value of a reflected signal.

The magnitude value of the reflected signal may be calculated by a formula of calculating a magnitude of a reflected wave, expressed as [Equation 1].

The phase value of the reflected signal may be calculated by a formula of calculating a phase of a reflected wave, expressed as [Equation 2].

A voltage may be controlled by using a Varactor diode further included in the matching network circuit so that a magnitude value and a phase value of the reflected signal are satisfied on each frequency.

BRIEF DESCRIPTION OF THE DRAWINGS

FIGS. 20 to 31 are views illustrating simulation results of FIG. 9 according to an embodiment of the present invention.

DETAILED DESCRIPTION

Figure 1:
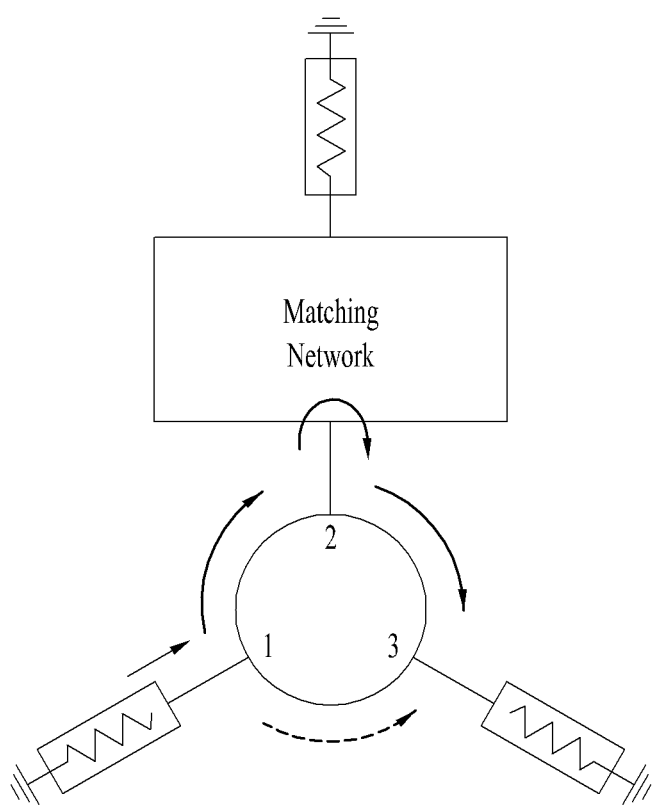
FIG. 1 is a view illustrating the structure of a matching network circulator according to an embodiment of the related art.

To fully understand advantages of the present invention and operations of the present invention, and objects achieved by implementing the present invention, reference should be made to the accompanying drawings illustrating preferred embodiments of the present invention, and what is shown therein. The features and advantages of the present invention will become apparent from the following description taken in conjunction with the accompanying drawings. And, the vocabularies or terminologies used in the detailed description and claims shall be interpreted as having a meaning and concept suitable for the technical spirit of the present invention based on the principle that the inventor can define the concept of the terminology by himself/herself in order to describe his/her invention in the best manner. In addition, a detailed description of well-known functions related to the present invention and their configurations will be avoided unless it unnecessarily obscures the subject matter of the present invention.

A circulator is a non-reciprocal 3-port device in which energy entering port 1 exits mainly from port 2, energy entering port 2 exits from port 3, and energy entering port 3 exits from port 1. However, the signal is partially leaked to another port, not fully reaching an intended port. How much the leakage signal is isolated is defined as isolation. The isolation of a typical circulator is roughly −20 dB. The isolation may be increased by counterbalance between "an insertion signal such as a signal flow from port 1 to port 2, from port 2 to port 3, or from port 3 to port 1" and "a leakage signal flowing from port 1 to port 3, from port 3 to port 1, or from port 2 to port 1". For example, when a signal is input to port 1, "an insertion signal passing in a path of port 1, port 2 and port 3" should be identical in magnitude to "a leakage signal from port 1 to port 3", with a phase difference of 180° in order to cancel the leakage signal. To this end, a matching network may be deployed in the middle of the insertion signal path. Although a matching network is usually used for the purpose of maximizing power transmission by reducing the amount of reflection between circuits, the matching network is used to control cancellation of a leakage signal with a reflection amount in the present invention. The resulting counterbalance between the leakage signal and the insertion signal may lead to high isolation.

To increase the isolation performance of the circulator, the insertion signal and the leakage signal should be identical in terms of magnitude and phase. However, a fixed matching network increases isolation only in one frequency, and may suffer from a limit on the isolation increase in view of soldering or differences between circulator parts. To overcome the limit, the magnitude and phase of the insertion signal may be changed by connecting a matching network with microstrip lines to Varactor diodes, and thus controlling a voltage. Thus, the isolation performance of the circulator which is changed by an external factor may be maintained high. Further, high isolation may be achieved even in a user-desired frequency across a plurality of bands. The Varactor diodes may be replaced with various voltage-controllable parts such as a transistor switch or the like.

That is, the present invention achieves high isolation by controlling the magnitude and phase of an insertion signal and hence counterbalancing the insertion signal with a leakage signal in a circulator by use of a matching network. Further, the present invention compensates for an isolation variation in an operating frequency, caused by an external factor by means of a Varactor diode, and changes the capacitance of the Varactor diode, thereby enabling switching to a user-desired operating frequency.

Figure 2:
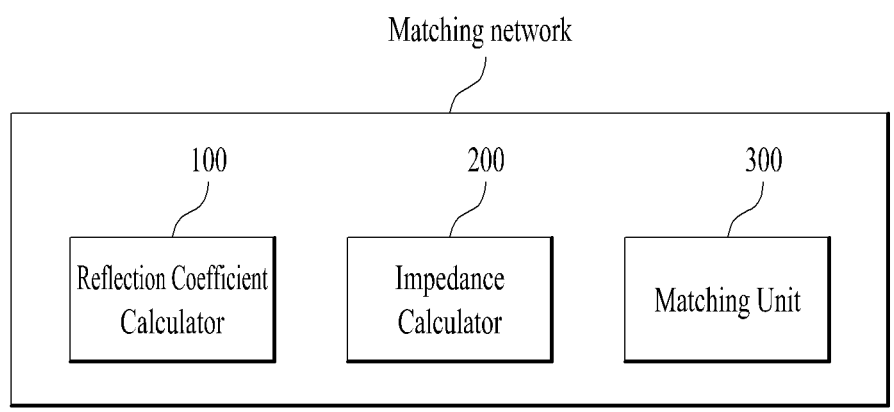
FIG. 2 is a schematic view illustrating a matching network system combined with a circulator according to an embodiment of the present invention.

FIG. 2 is a schematic view illustrating the configuration of a matching network system combined with a circulator according to an embodiment of the present invention. As illustrated in FIG. 2, the matching network system combined with a circulator includes a reflection coefficient calculator 100 that calculates a per-frequency reflection coefficient required to cancel a signal leaked (a leakage signal) from a port combined with an antenna (an antenna port), an impedance calculator 200 that calculates and impedance value form the calculated reflection coefficient and a matching unit 300 that matches an antenna by a matching network circuit that changes the impedance value of any antenna to the calculated impedance value.

The reflection coefficient of the reflection coefficient calculator 100 includes the magnitude and phase values of a reflected signal.

The magnitude value of the reflected signal is calculated by a formula of calculating the magnitude of a reflected wave, given as [Equation 1]. [Equation 1] is derived from mag(S21)×|Γ|×mag(S32)=mag(S31).

$$|\Gamma| = \frac{mag(S31)}{mag(S21) \times mag(S32)} \quad \text{[Equation 1]}$$

where |Γ| represents the magnitude value of the reflected signal, mag(S21) represents the magnitude value of a signal traveling from an input port to the antenna port, mag(S31) represents the magnitude value of a leakage signal in the circulator, and mag(S32) represents the magnitude value of a signal traveling from the antenna port to an output port.

The phase value of the reflected signal is calculated by a formula of calculating the phase of a reflected wave, given as [Equation 2]. [Equation 2] is derived from Phase(S21)+∠Γ+Phase(S32)−Phase(S31)=nπ, (n=1, 3, 5, 7 . . . ).

$$\angle\Gamma = n\pi + \text{Phase}(S31) - \text{Phase}(S21) - \text{Phase}(S32) \quad \text{[Equation 2]}$$

where ∠Γ represents the phase value of the reflected signal, Phase(S31) represents the phase value of the leakage signal in the circulator, Phase(S21) represents the phase value of the signal traveling from the input port to the antenna port, Phase(S32) represents the phase value of the signal traveling from the antenna port to the output port, and n=1, 3, 5, 7 . . . .

Characteristically, a voltage is controlled by means of a Varactor diode further included in the matching network circuit so that the magnitude and phase values of the reflected signal are satisfied on each frequency.

Figure 3:
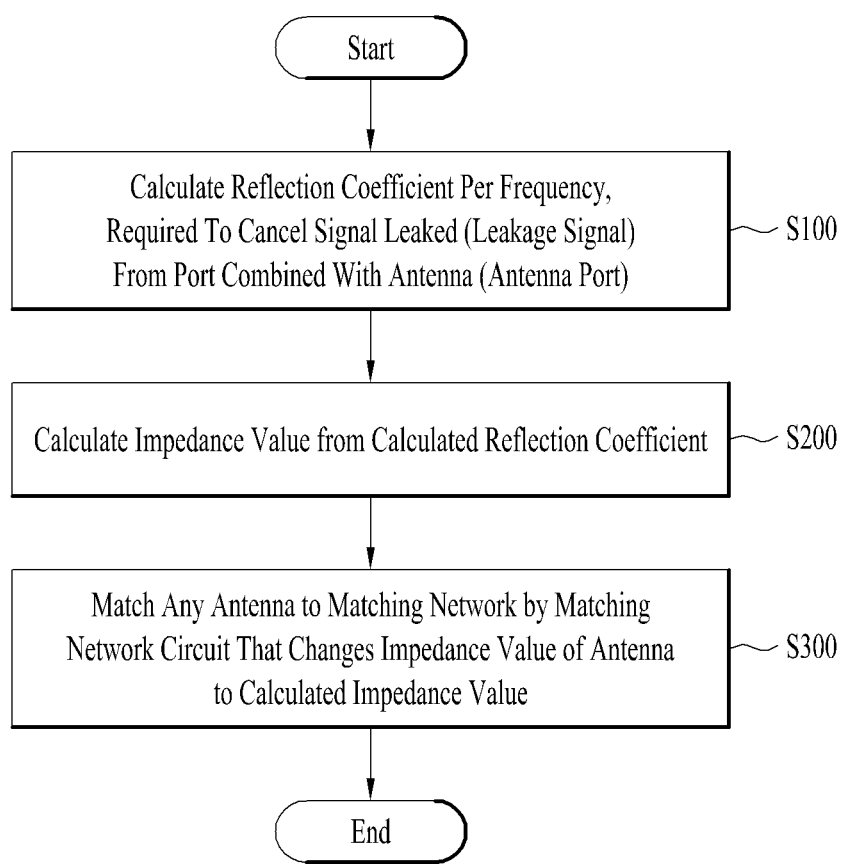
FIG. 3 is a flowchart illustrating a method of a matching network system combined with a circulator according to an embodiment of the present invention.

FIG. 3 is a flowchart illustrating a method of a matching network system combined with a circulator according to an embodiment of the present invention. As illustrated in FIG. 3, the method of a matching network system combined with a circulator includes calculating a per-frequency reflection coefficient required to cancel a signal leaked (leakage signal) from a port combined with an antenna (antenna port) by the reflection coefficient calculator 100 (S100), calculating an impedance value from the calculated reflection coefficient by the impedance calculator 200 (S200), and matching an antenna by use of the matching network circuit that changes the impedance value of any antenna to the calculated impedance value by the matching unit 300 (S300), thereby controlling cancellation of the leakage signal.

In the reflection coefficient calculation step S100, the reflection coefficient includes the magnitude and phase values of a reflected signal.

Characteristically, the magnitude value of the reflected signal is calculated by a formula of calculating the magnitude of a reflected wave, given as [Equation 1].

Characteristically, the phase value of the reflected signal is calculated by a formula of calculating the phase of a reflected wave, given as [Equation 2].

Characteristically, a voltage is controlled by means of a Varactor diode further included in the matching network circuit so that the magnitude and phase values of the reflected signal are satisfied on each frequency.

The present invention will be described below in greater detail with reference to a simulation. For the simulation, reference is made to FIGS. 7 to 18. The simulation is performed in the following steps according to an embodiment of the present invention.

(1) To analyze a signal inside the circulator, the circulator is connected to a 50-ohm line, and then measured by a vector network analyzer (VNA).

(2) A unique signal of the circulator is checked from the measured circulator value by de-embedding the 50-ohm line from the circulator, using a commercial circuit simulator "Advanced Design System".

(3) After the matching network is connected to a Varactor diode by using the checked unique signal of the circulator, a layout process is performed, thereby achieving simulation results.

(4) A circuit fabricated in a process is measured by the VNA.

(5) The measurement results obtained in the step of (4) are compared and analyzed with the simulation results obtained in the step of (3).

Figure 4:
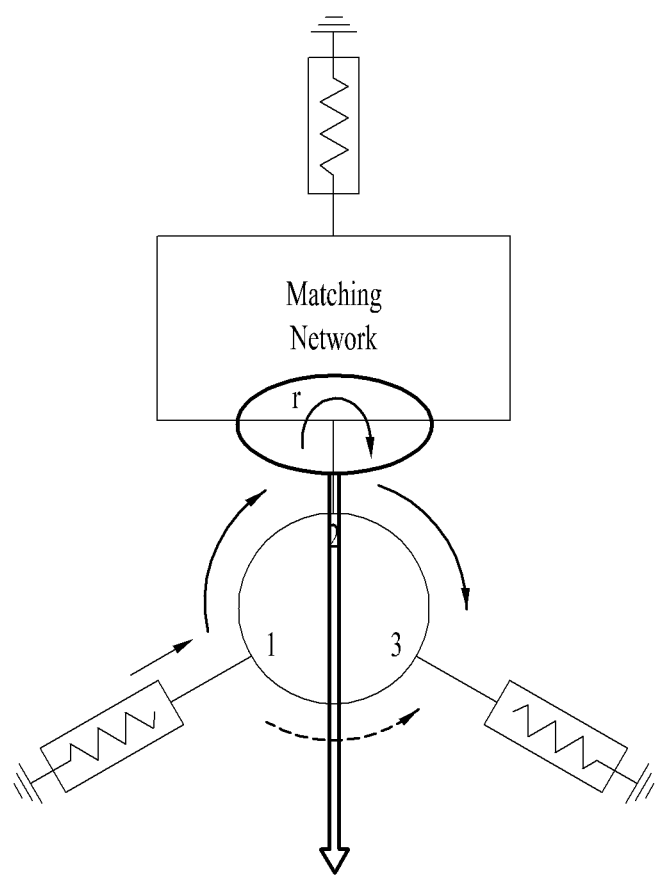
FIG. 4 is a view illustrating the concept of increasing the isolation of a circulator by cancelling a leakage signal through adjustment of the magnitude and phase of an insertion signal (i.e., throw signal) according to an embodiment of the present invention.

FIG. 4 is a view illustrating the concept of increasing the isolation of a circulator by cancelling a leakage signal through adjustment of the magnitude and phase of an insertion signal according to an embodiment of the present invention. As illustrated in FIG. 4, a signal entering port 1 is separately provided to port 2 and port 3. Then, to increase the isolation of the circulator, leakage cancellation is performed such that "a signal obtained by reflecting a signal traveling from port 1 to port 2, and passing the reflected signal from port 2 to port 3" has the same magnitude as that of "a signal traveling from port 1 to port 3", with a phase difference of 180°.

Figure 5:
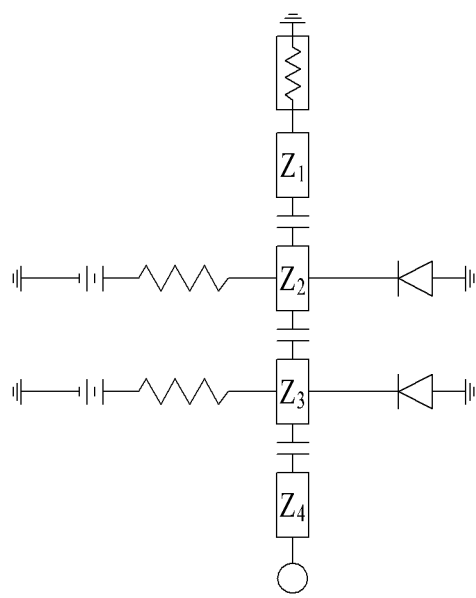
FIG. 5 is a circuit diagram illustrating a matching network connected to a circulator according to an embodiment of the present invention.
Figure 6:
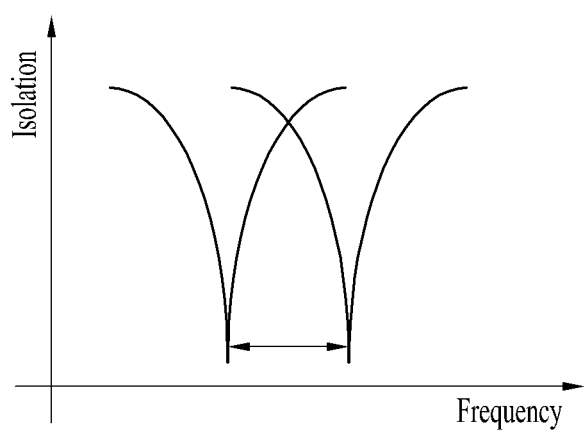
FIG. 6 is a view illustrating frequency switching with high isolation according to an embodiment of the present invention.

FIG. 5 is a circuit diagram illustrating a matching network connected to a circulator according to an embodiment of the present invention, and FIG. 6 is a view illustrating frequency switching with high isolation according to an embodiment of the present invention. As illustrated in FIG. 5, a matching network is configured with a total of four transmission lines having different characteristic impedances, and then connected to Varactor diodes so as to enable correction of an isolation error in an operating frequency and frequency switching. In an embodiment of the present invention, frequency switching is enabled by use of two Varactor diodes. The number of Varactor diodes may easily be changed by a user setting. Thus, as noted from FIG. 6, frequency switching takes place in the circulator, while high isolation is maintained.

Figure 7A:
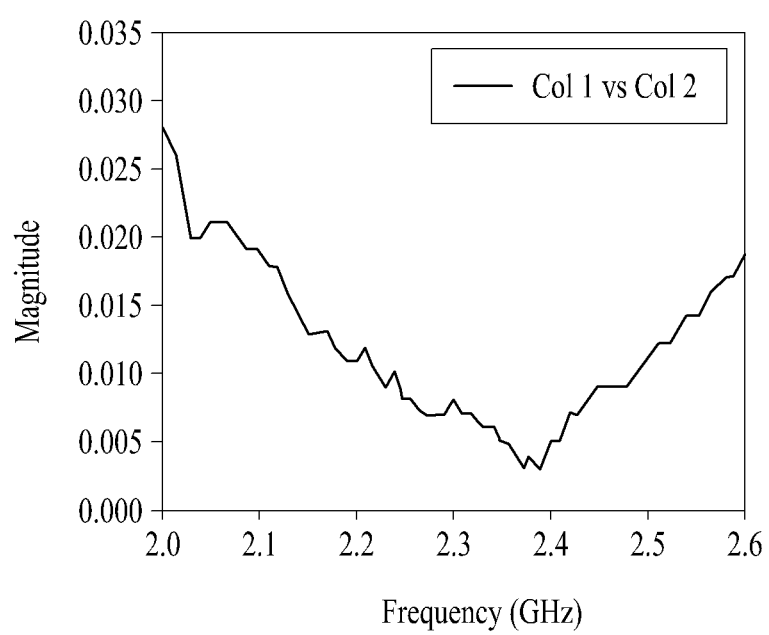
FIGS. 7a and 7b are views illustrating ranges of reflection coefficients Γ of an insertion signal, required for high isolation according to an embodiment of the present invention.
Figure 7B:
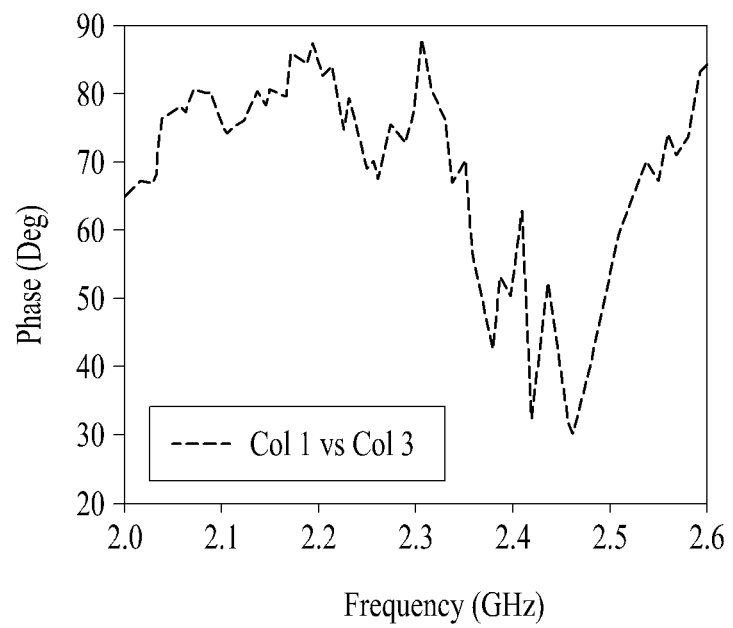
Figure 7C:
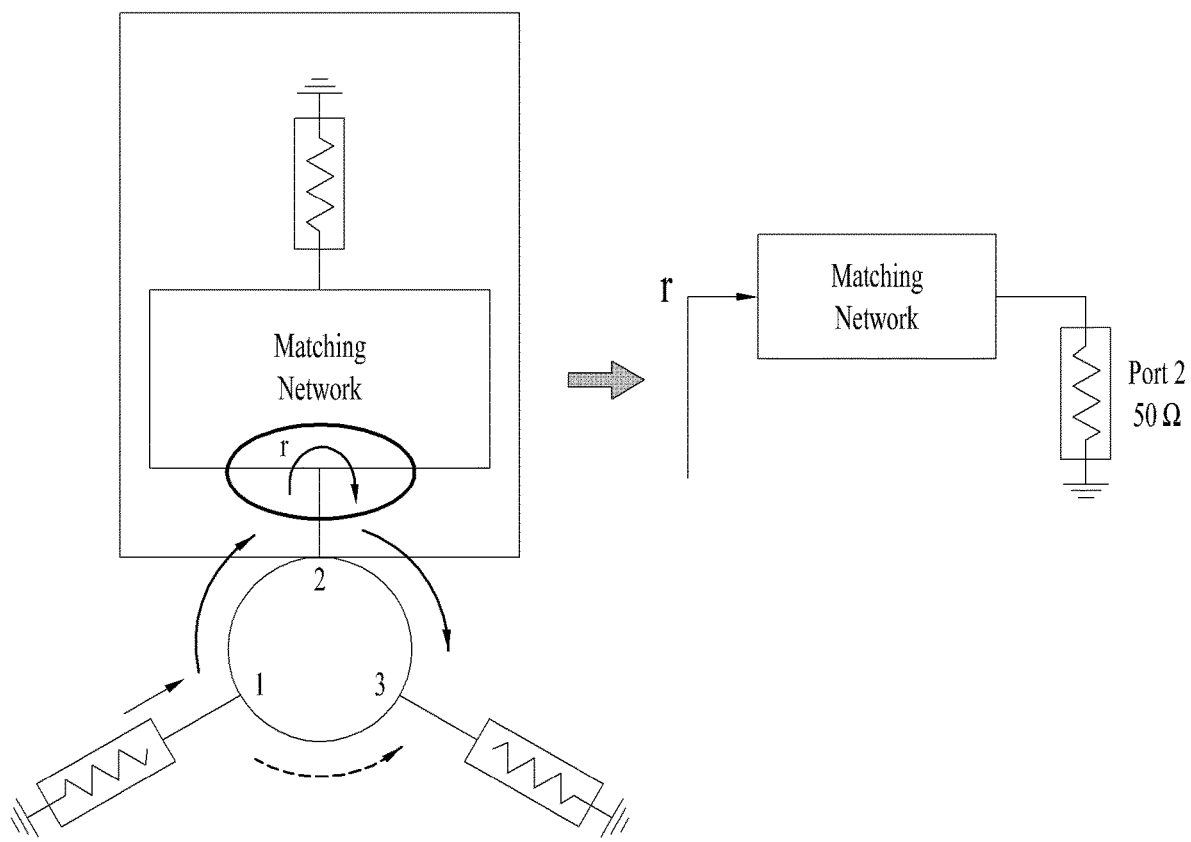
FIG. 7c is a view illustrating application of the reflection coefficients Γ of FIGS. 7a and 7b to a matching network according to an embodiment of the present invention.

With reference to FIGS. 7a to 7c, an impedance selection method of the present invention will be described in greater detail.

FIGS. 7a and 7b are views illustrating ranges of reflection coefficients Γ of an insertion signal, required for high isolation according to an embodiment of the present invention, and FIG. 7c is a view illustrating application of the reflection coefficients Γ of FIGS. 7a and 7b to a matching network.

As illustrated in FIGS. 7a to 7c, a per-frequency reflection coefficient required to cancel a signal leaked (leakage signal) from a port combined with an antenna (antenna port) is calculated. FIG. 7a illustrates a range of per-frequency magnitudes for a reflected signal, and FIG. 7b illustrates a range of per-frequency phases for a reflected signal. An impedance value is calculated from the calculated reflection coefficient. That is, the impedance value is calculated by applying the calculated reflection coefficient to a Smith chart.

Figure 8A:
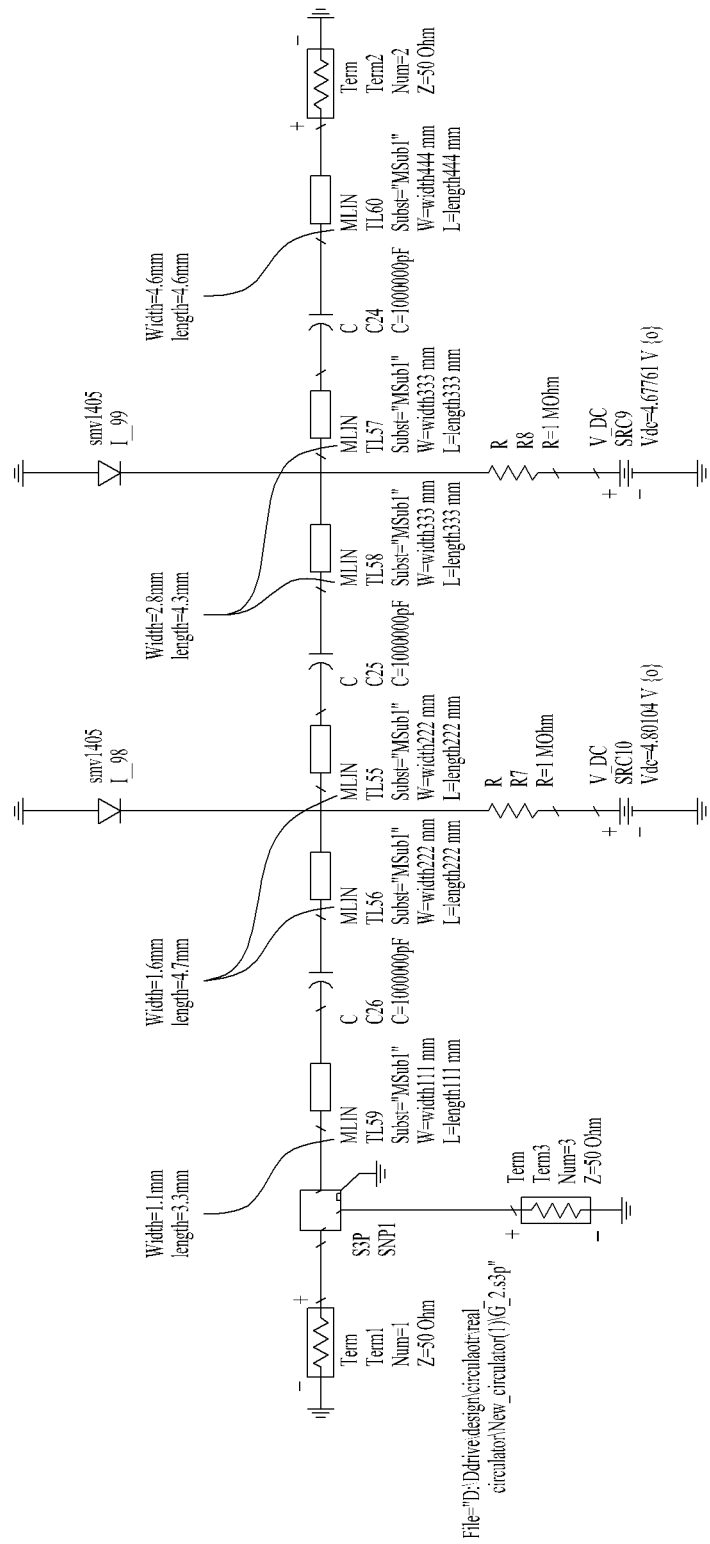
FIG. 8a is a view illustrating a physical length of a matching network, based on an impedance value calculated from FIGS. 7a to 7c.
Figure 8B:
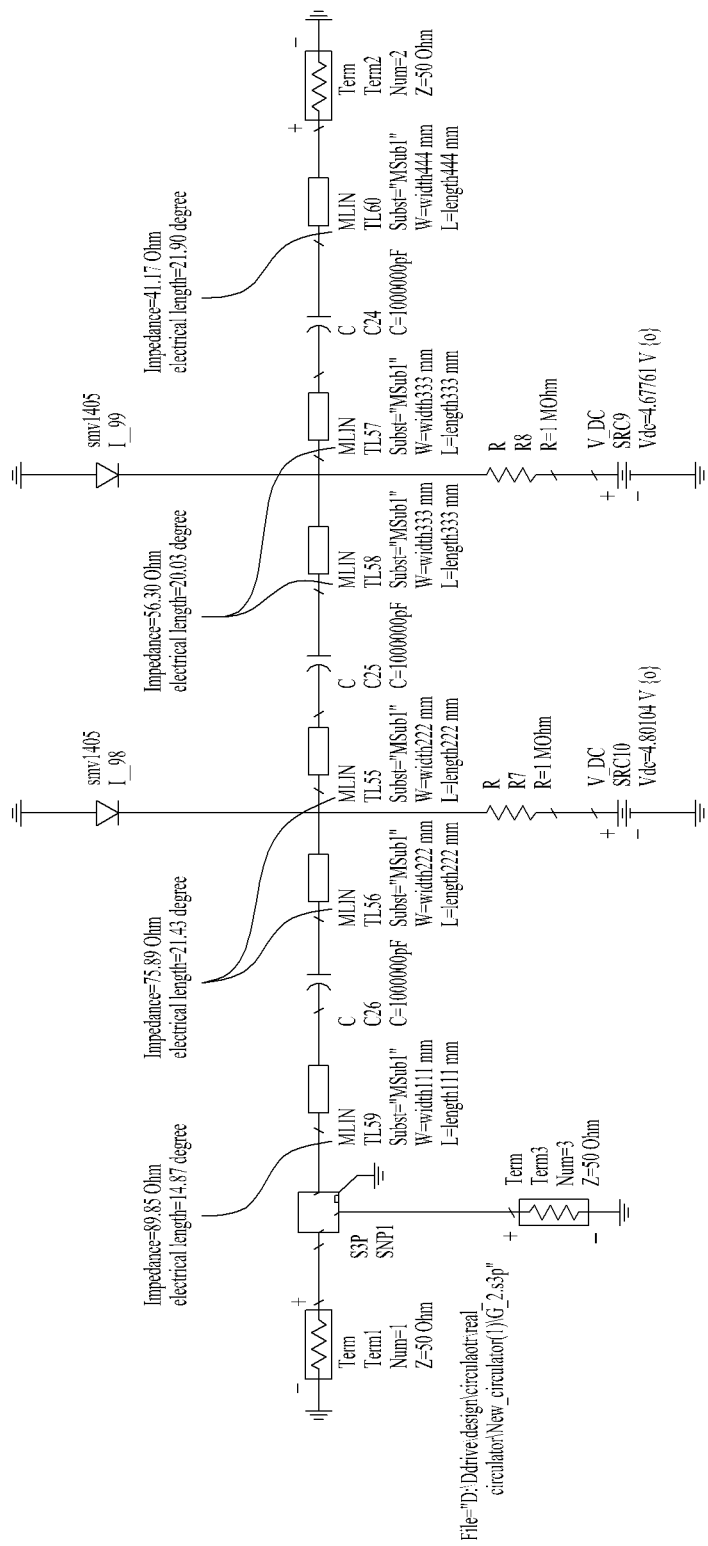
FIG. 8b is a view illustrating an electrical length of a matching network, based on an impedance value calculated from FIGS. 7a to 7c.

FIG. 8a is a view illustrating a physical length of a matching network, based on an impedance value calculated from FIGS. 7a to 7c, and FIG. 8b is a view illustrating an electrical length of a matching network, based on an impedance value calculated from FIGS. 7a to 7c.

Figure 9:
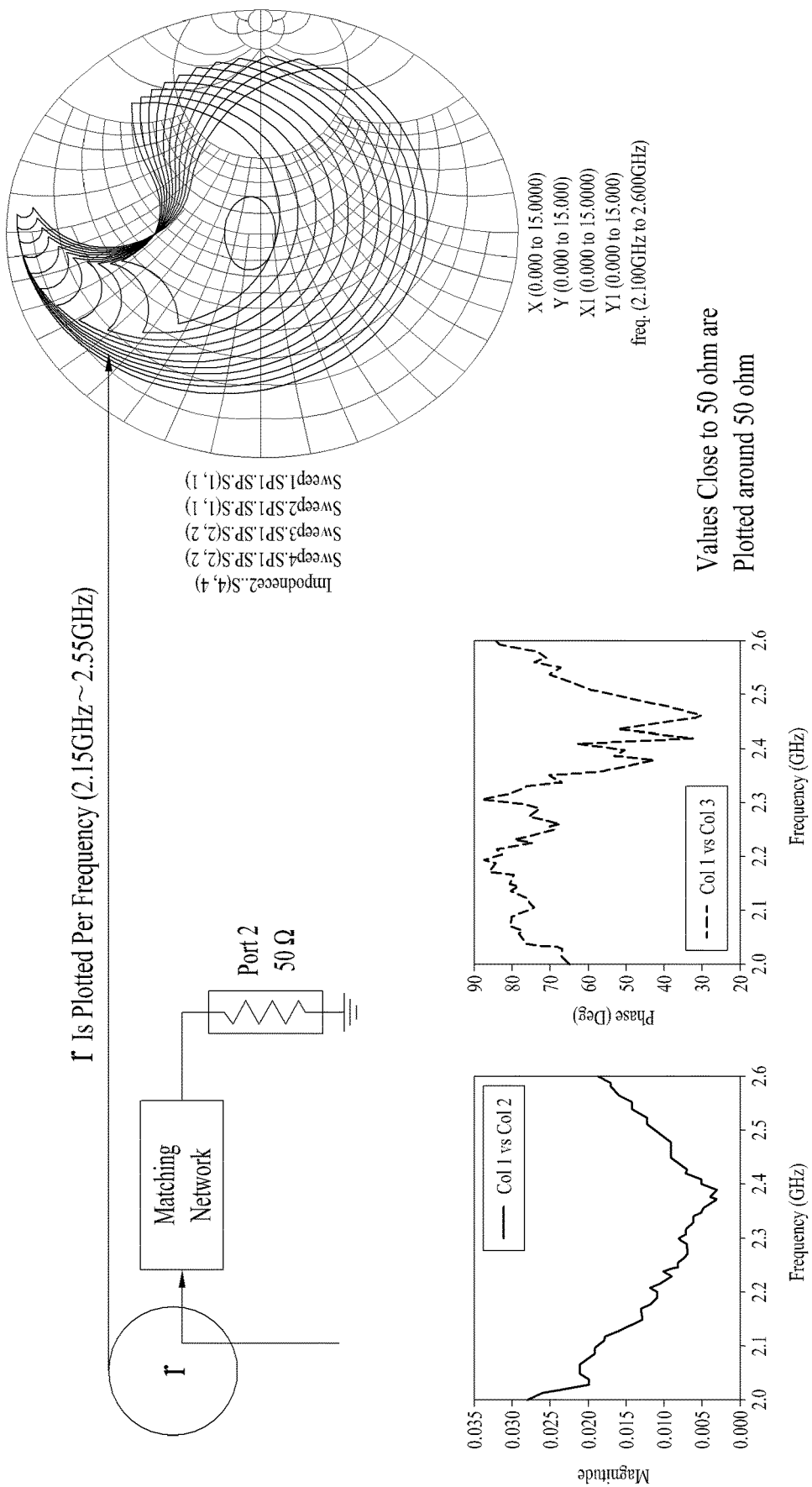
FIG. 9 is a view illustrating a Smith chart on which the reflection coefficients Γ illustrated in FIGS. 7a to 7c are plotted according to an embodiment of the present invention.
Figure 10:
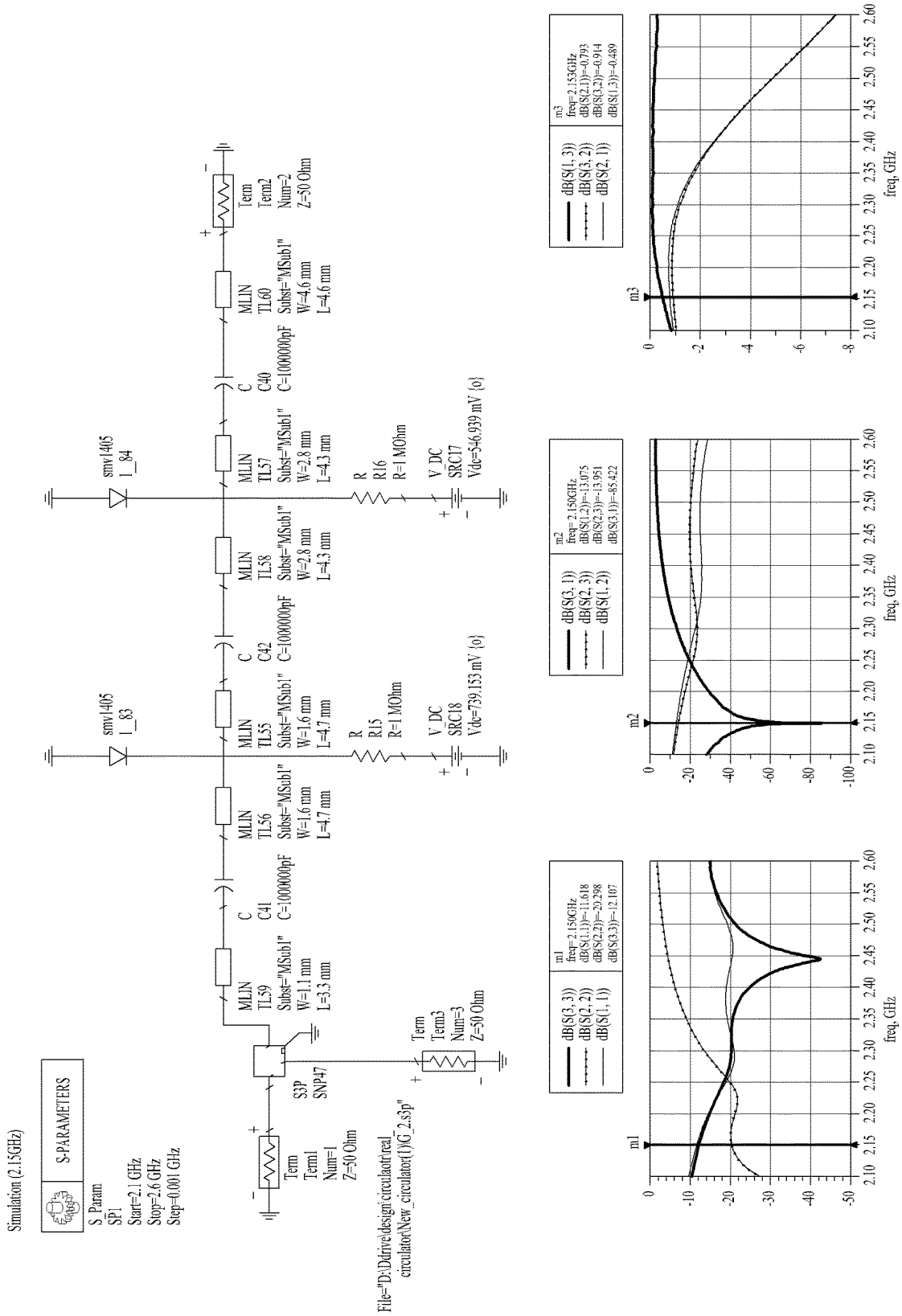
FIGS. 10 to 18 are views illustrating simulation results of FIG. 9 according to an embodiment of the present invention.
Figure 11:
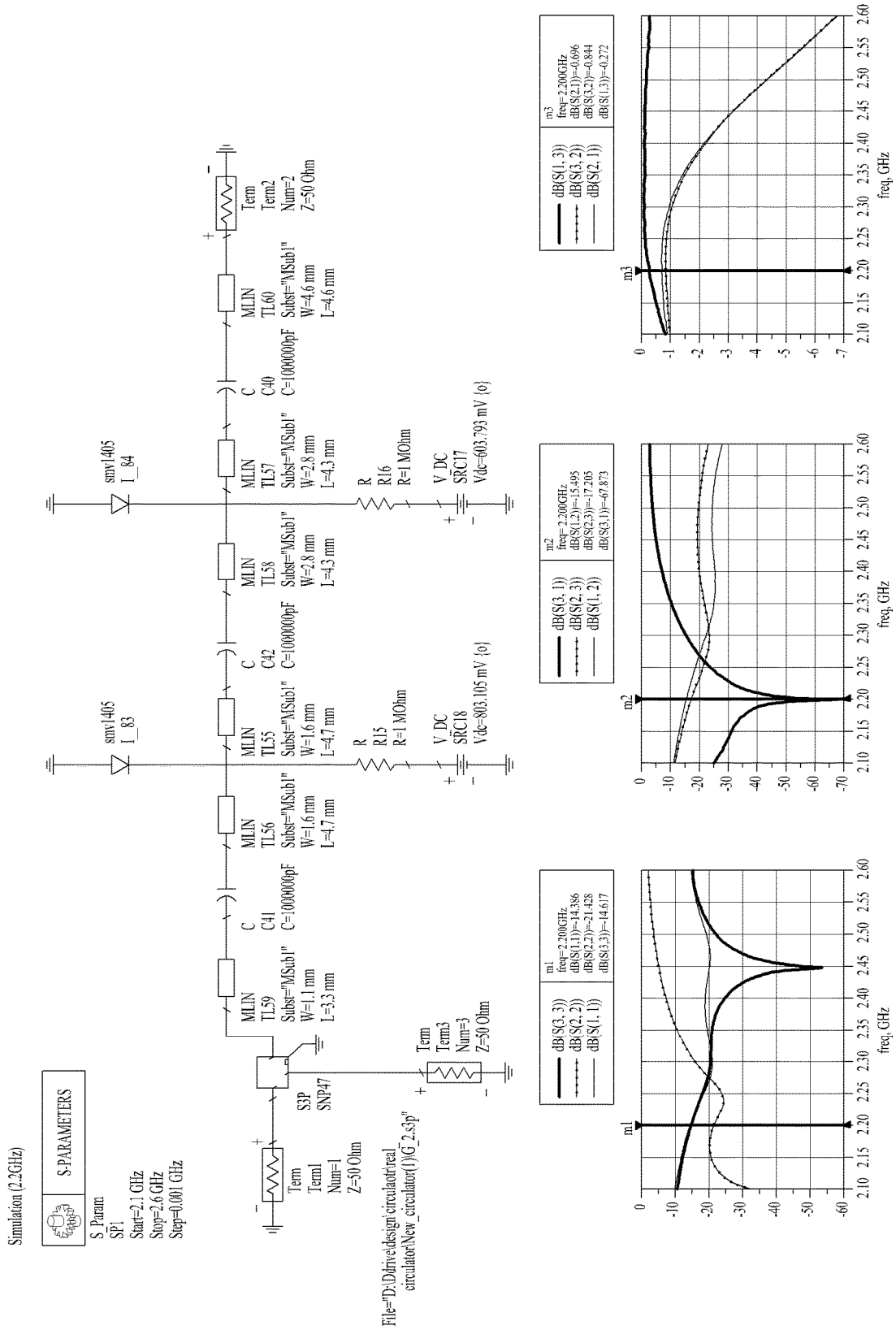
Figure 12:
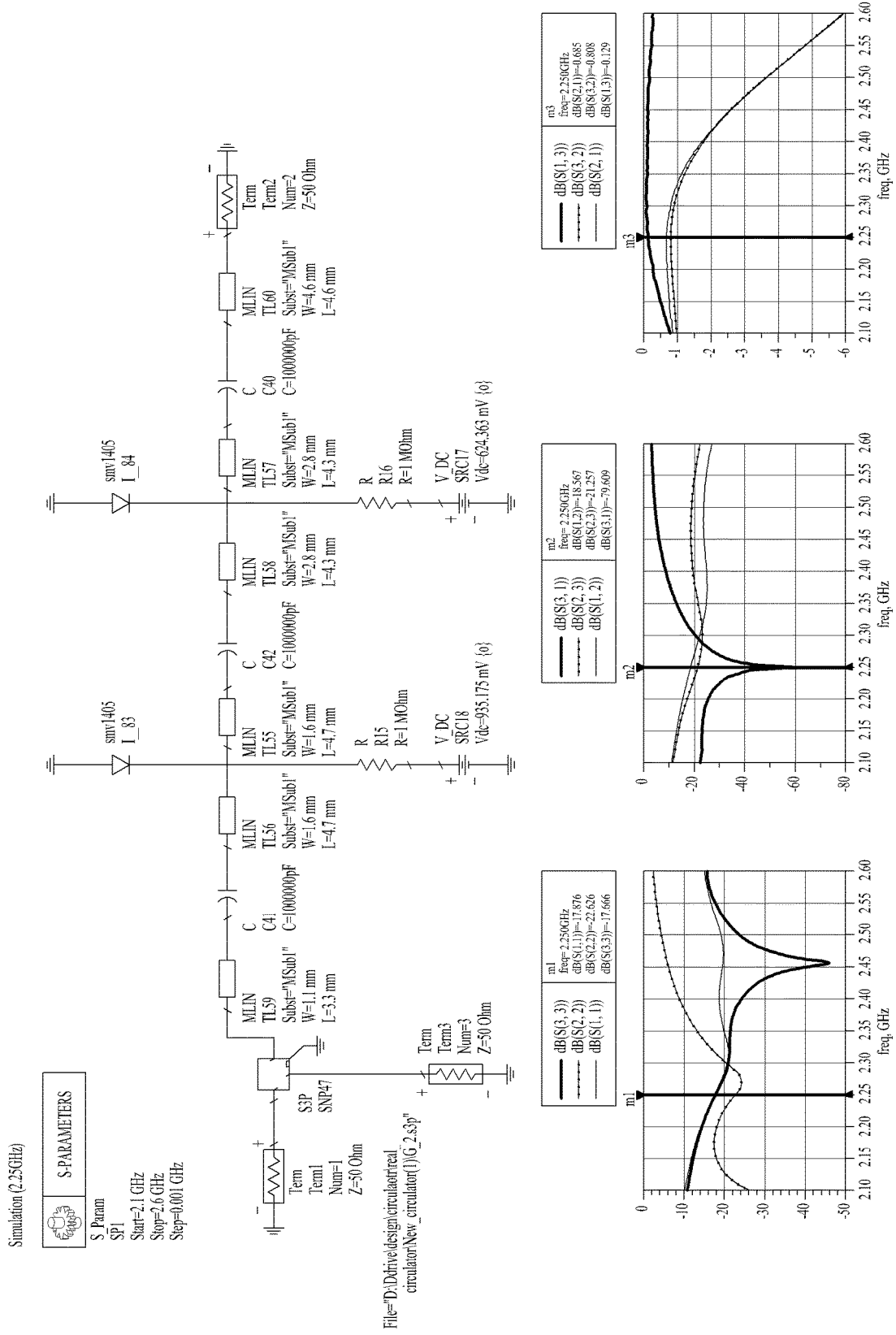
Figure 13:
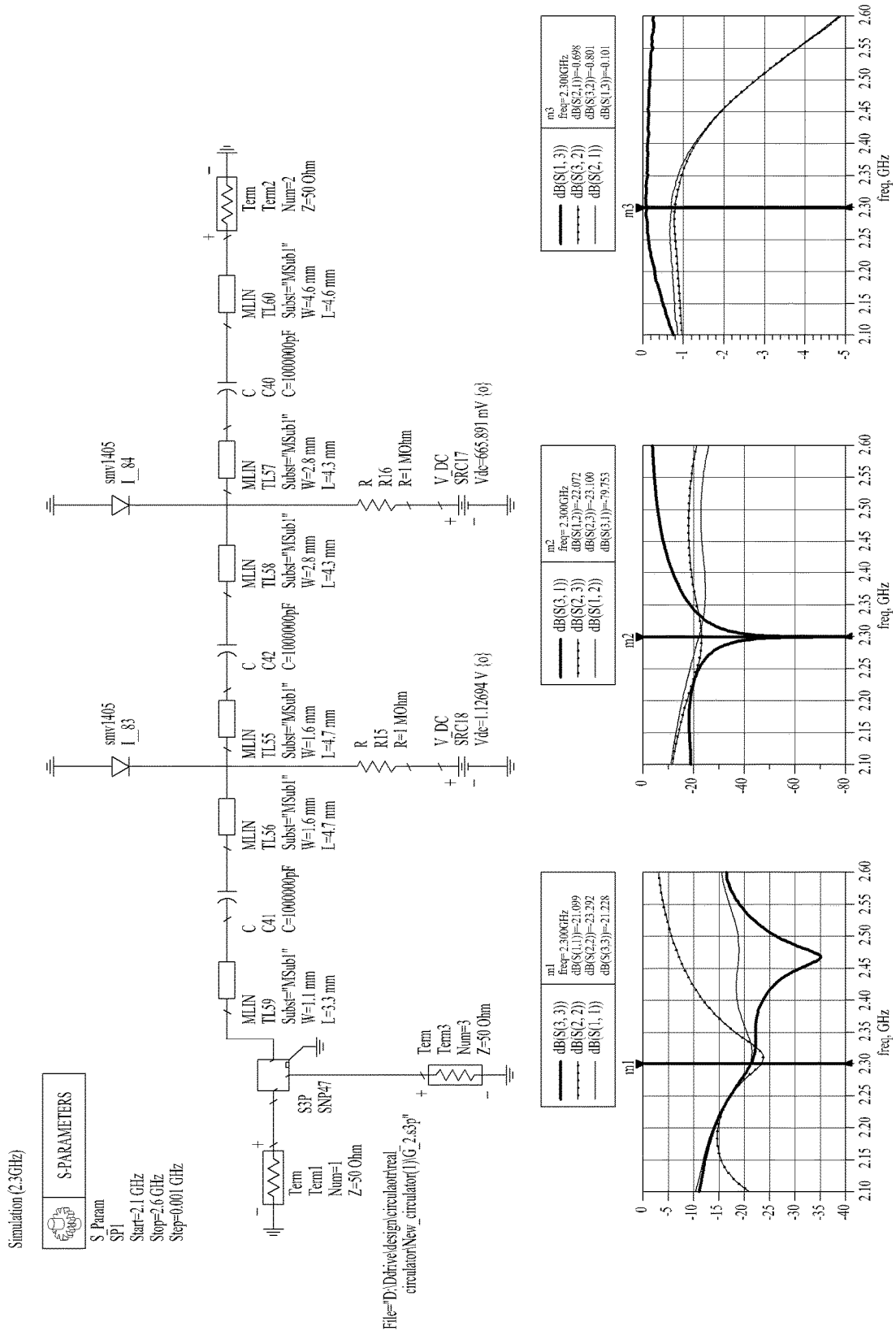
Figure 14:
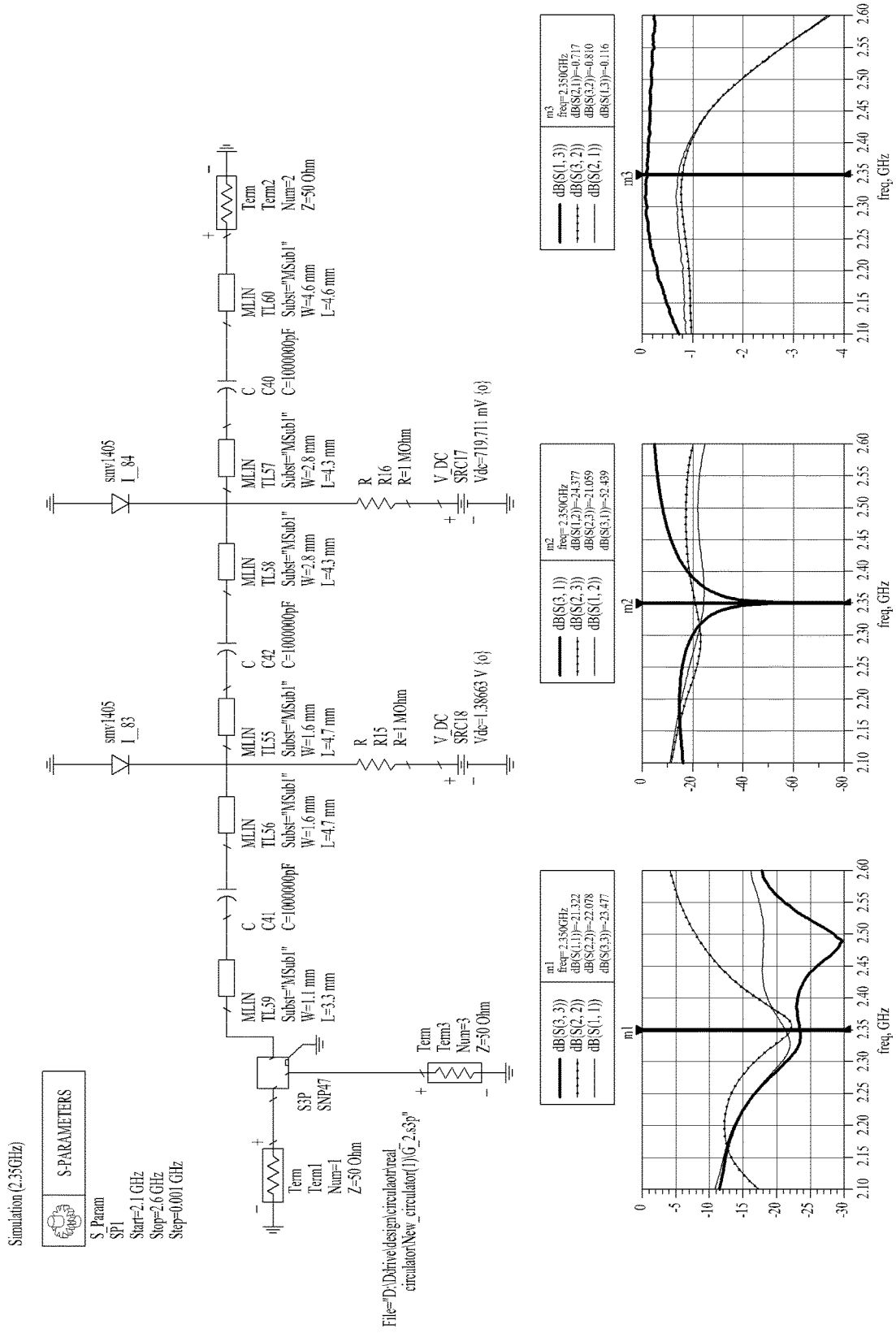
Figure 15:
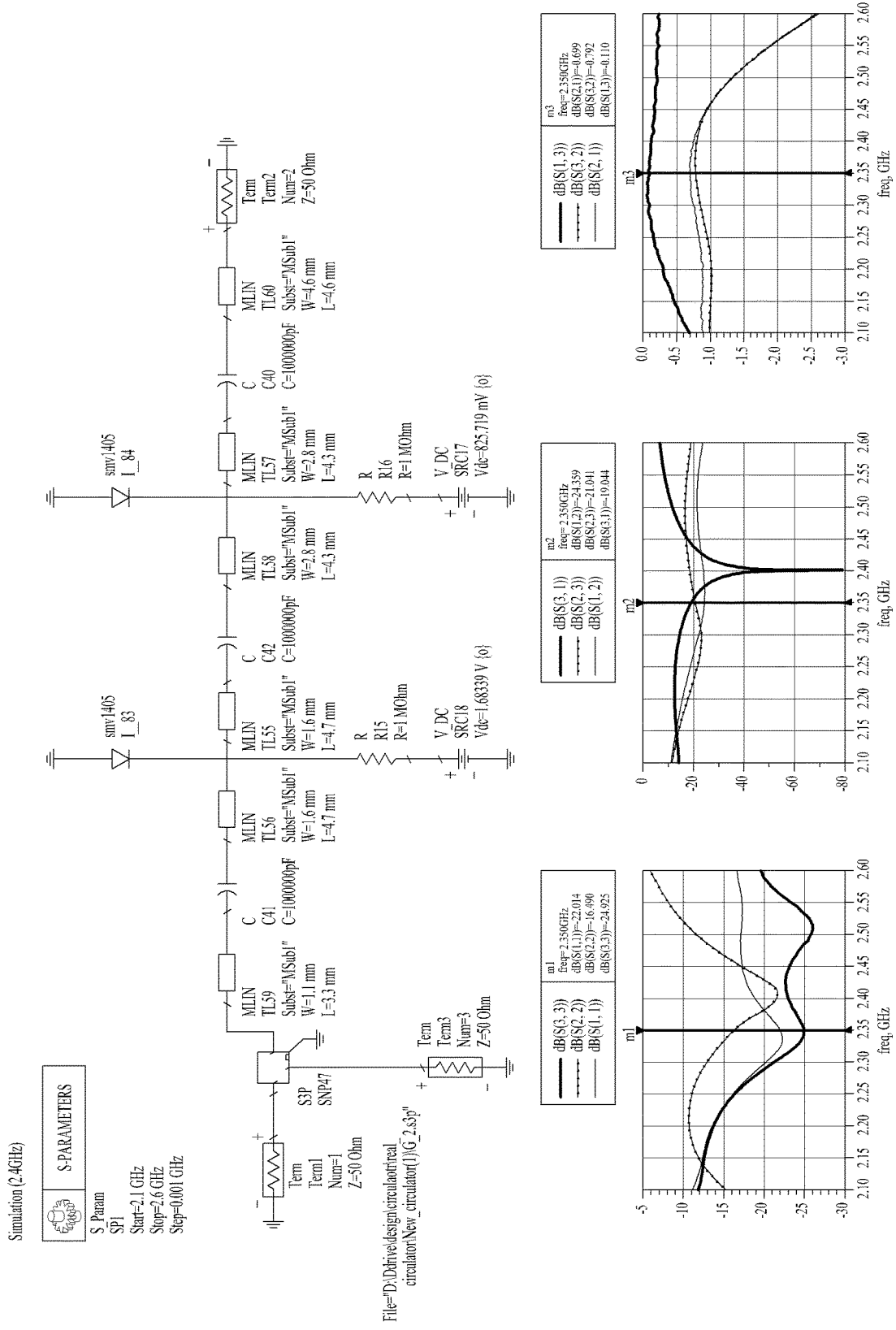
Figure 16:
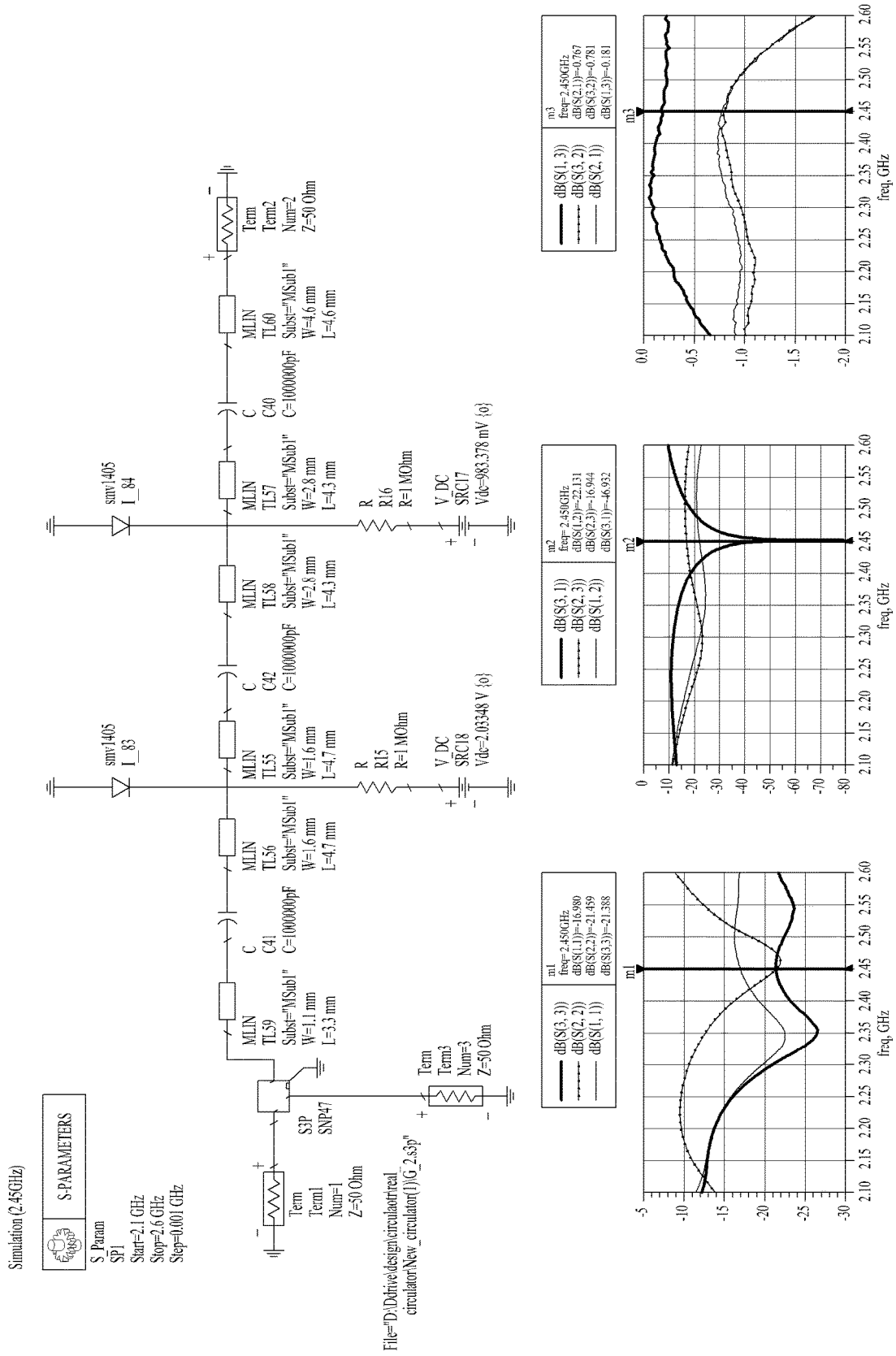
Figure 17:
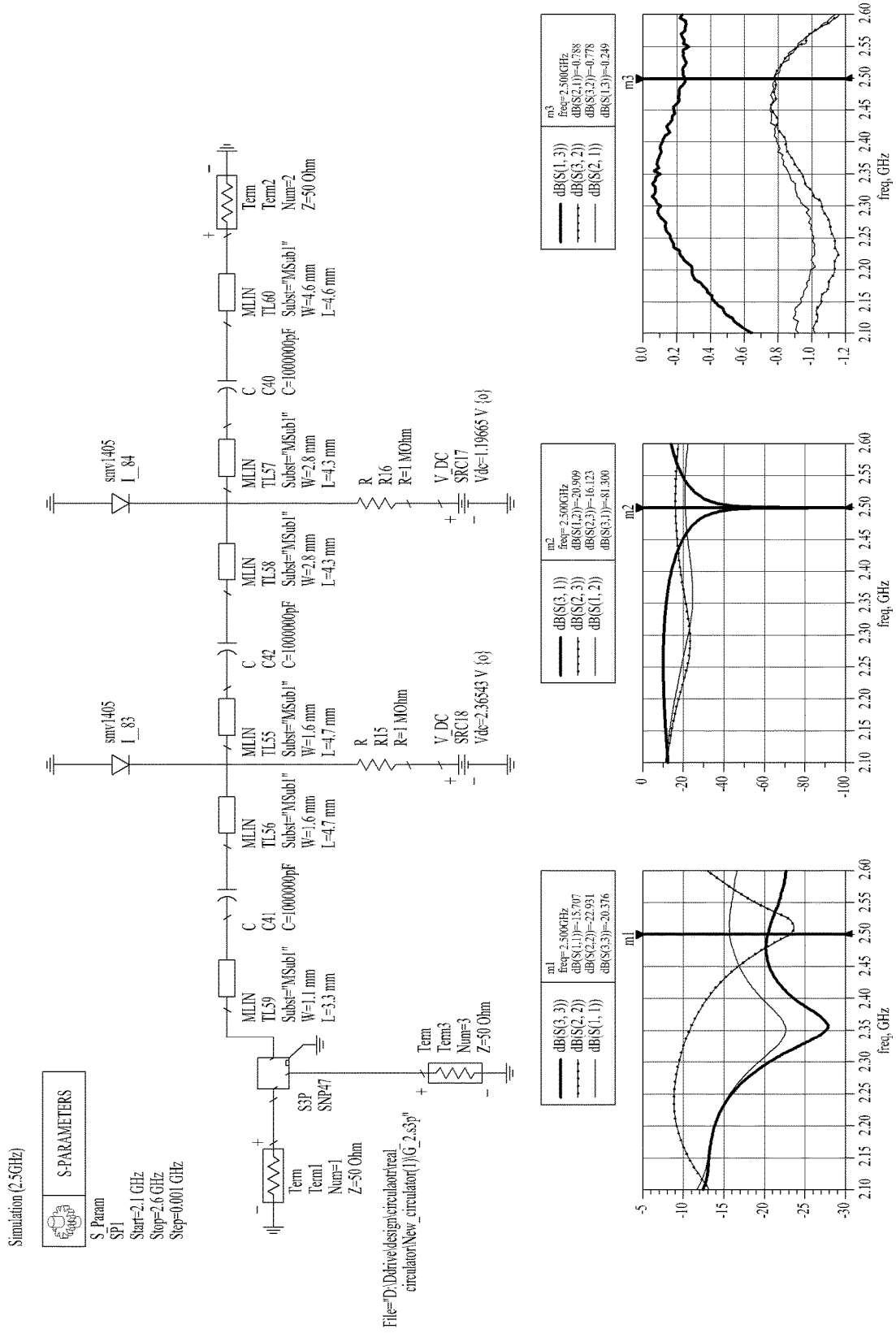
Figure 18:
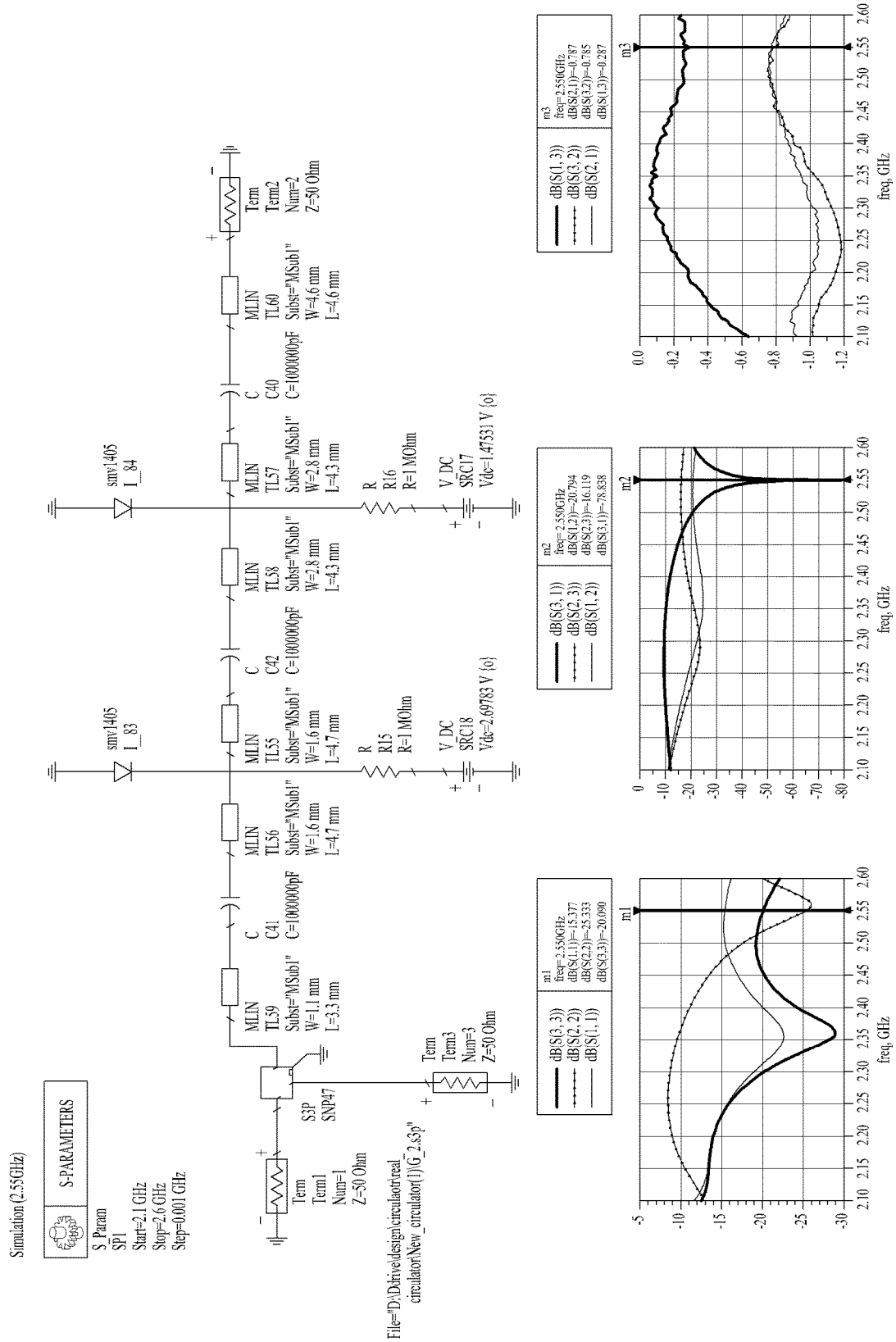

FIG. 9 is a view illustrating a Smith chart on which the reflection coefficients Γ of FIGS. 7a to 7c are plotted according to an embodiment of the present invention. As illustrated in FIG. 9, the magnitude of a reflected signal is very small, in the vicinity of 50 ohm, while only the phase of the reflected signal is changed. Accordingly, reflected signals are plotted in the vicinity of the center of the Smith chart. Meanwhile, it may be noted that as the voltage of the Varactor diode changes, impedances viewed toward the matching network are all included in the vicinity of the center of the Smith chart, and thus a leakage signal is isolated in a frequency ranging from 2.15 GHz to 2.55 GHz.

FIGS. 10 to 18 are views illustrating simulation results of FIG. 9 according to an embodiment of the present invention. As illustrated in FIGS. 10 to 18, with the values of other lines or devices fixed, only a voltage is changed.

Figure 19:
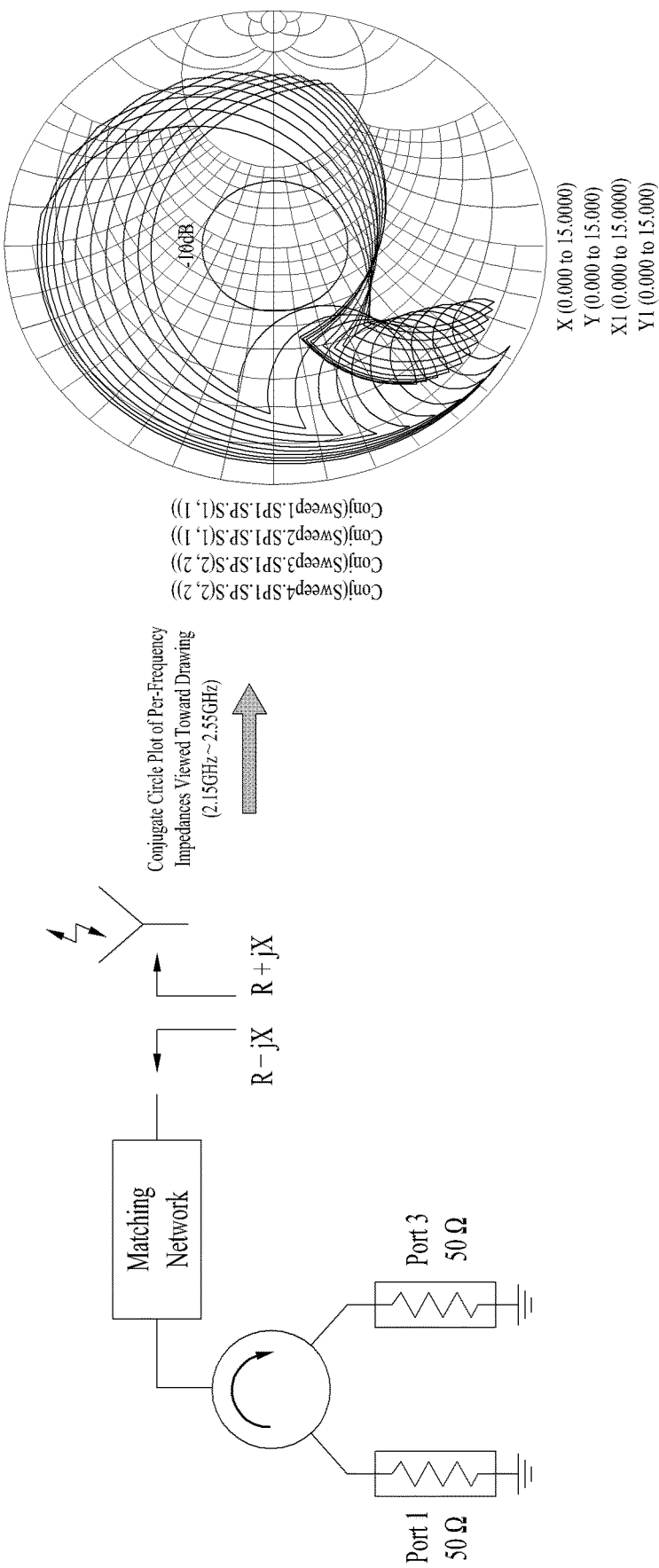
FIG. 19 is a view illustrating high isolation which is maintained even for the impedance of any antenna in a matching network of the present invention according to an embodiment of the present invention.
Figure 20:
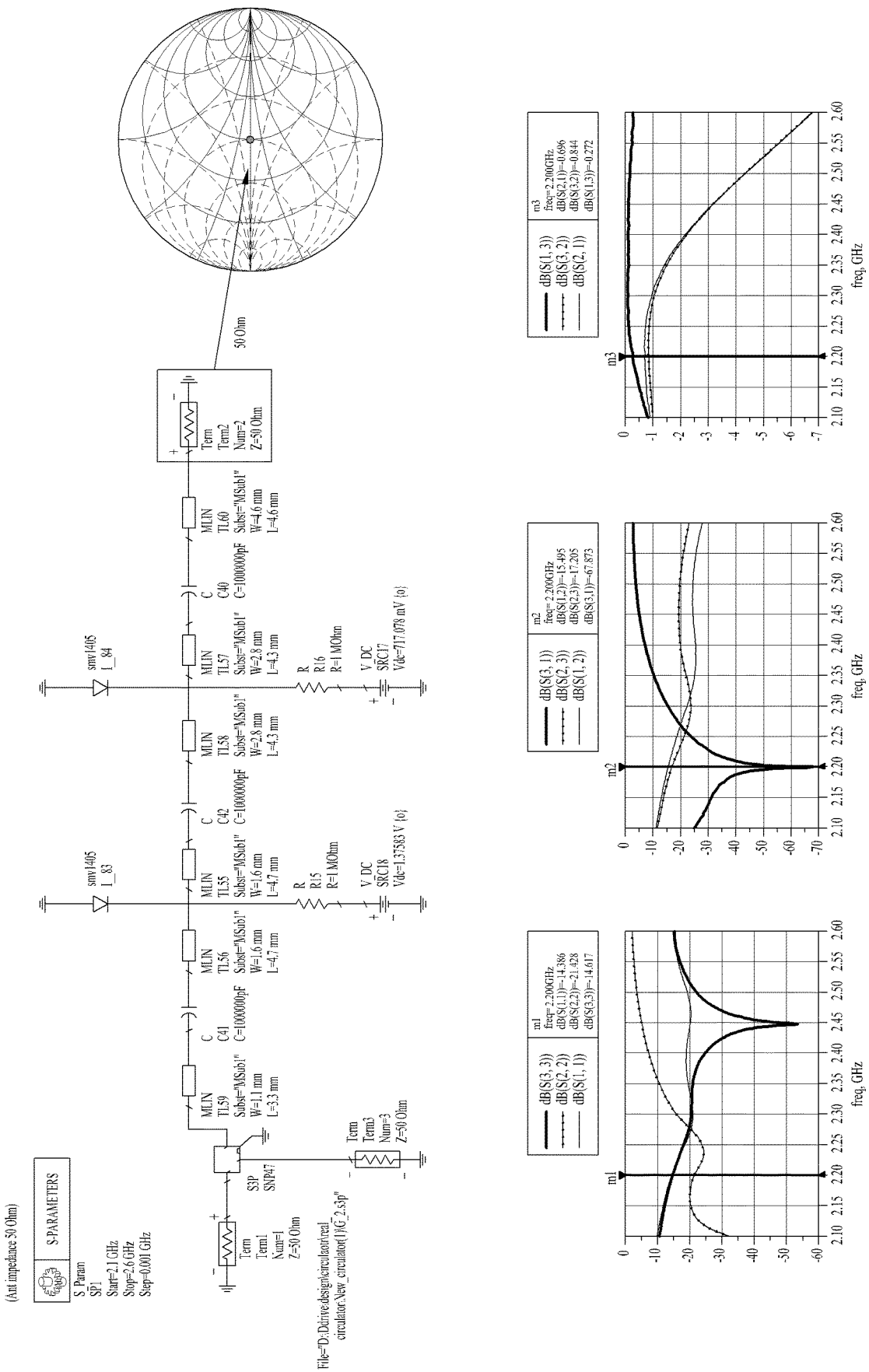
Figure 21:
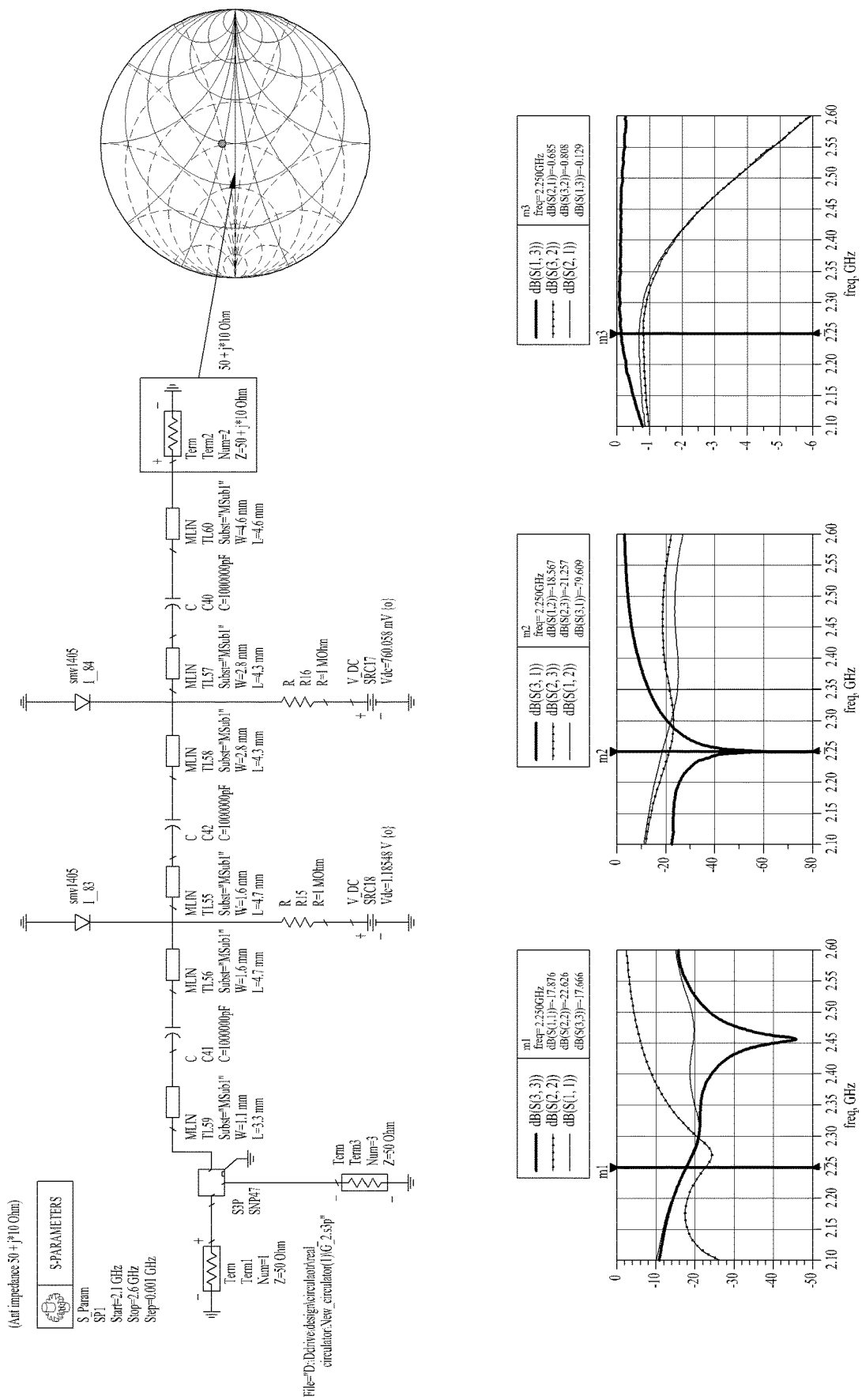
Figure 22:
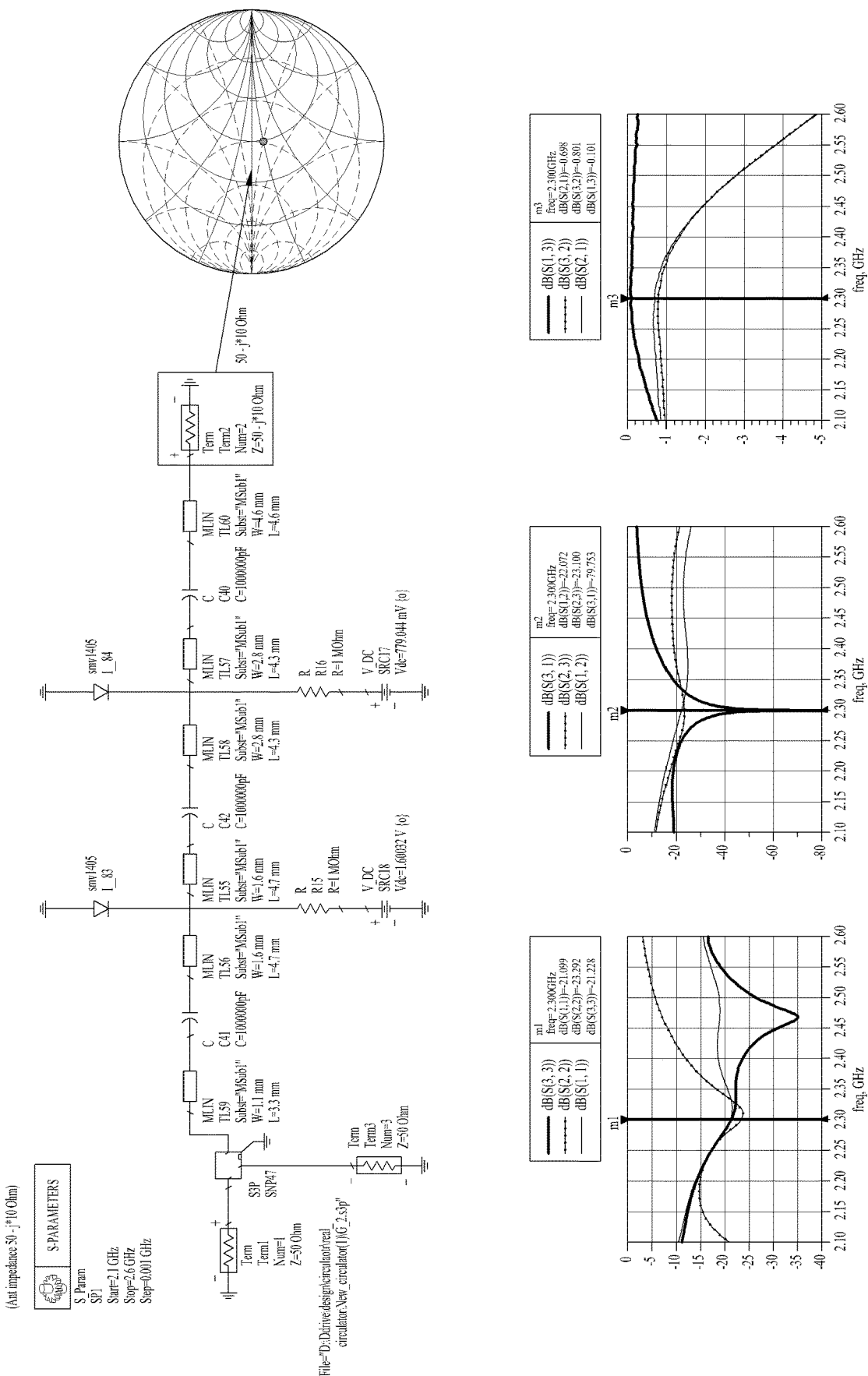
Figure 23:
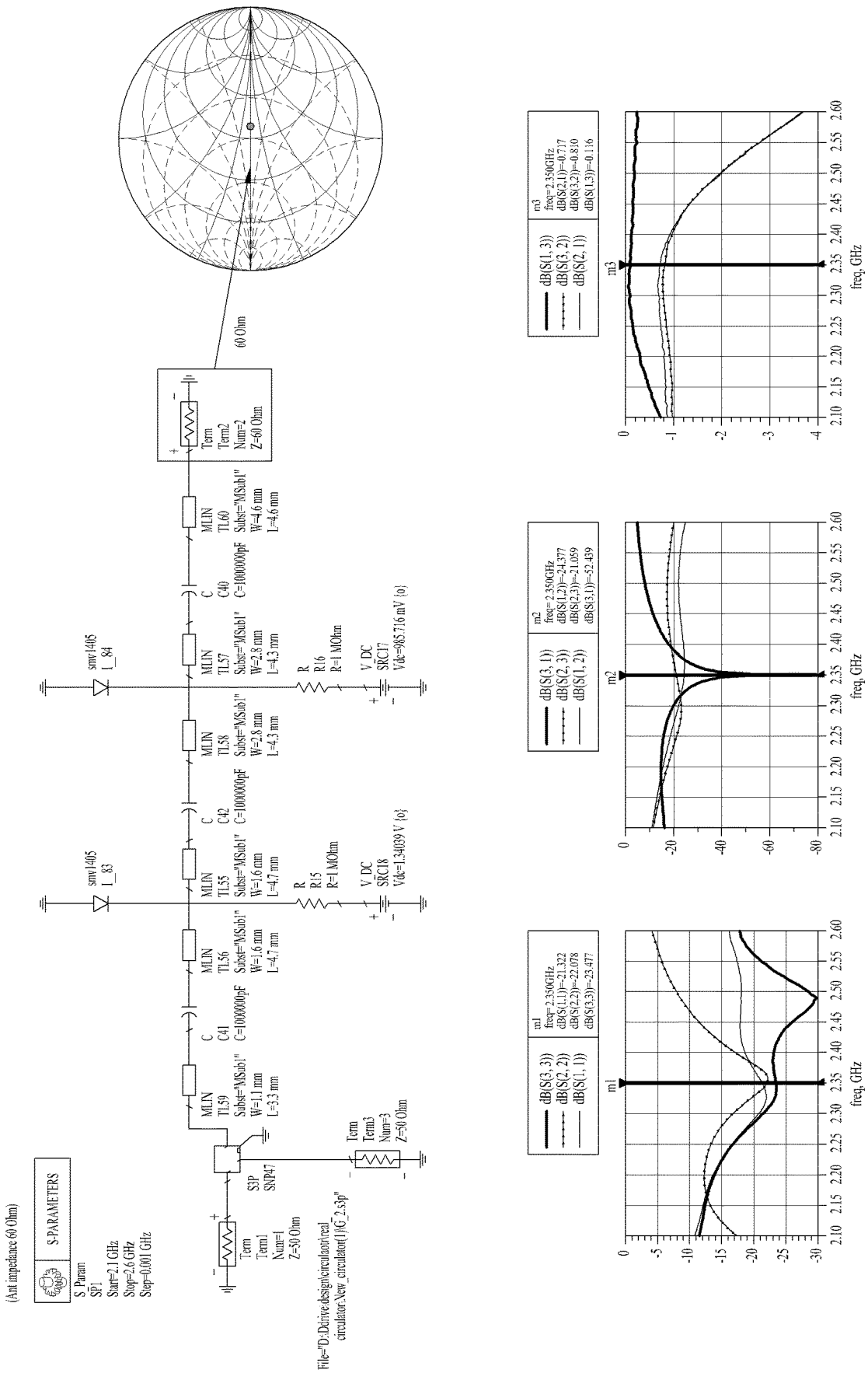
Figure 24:
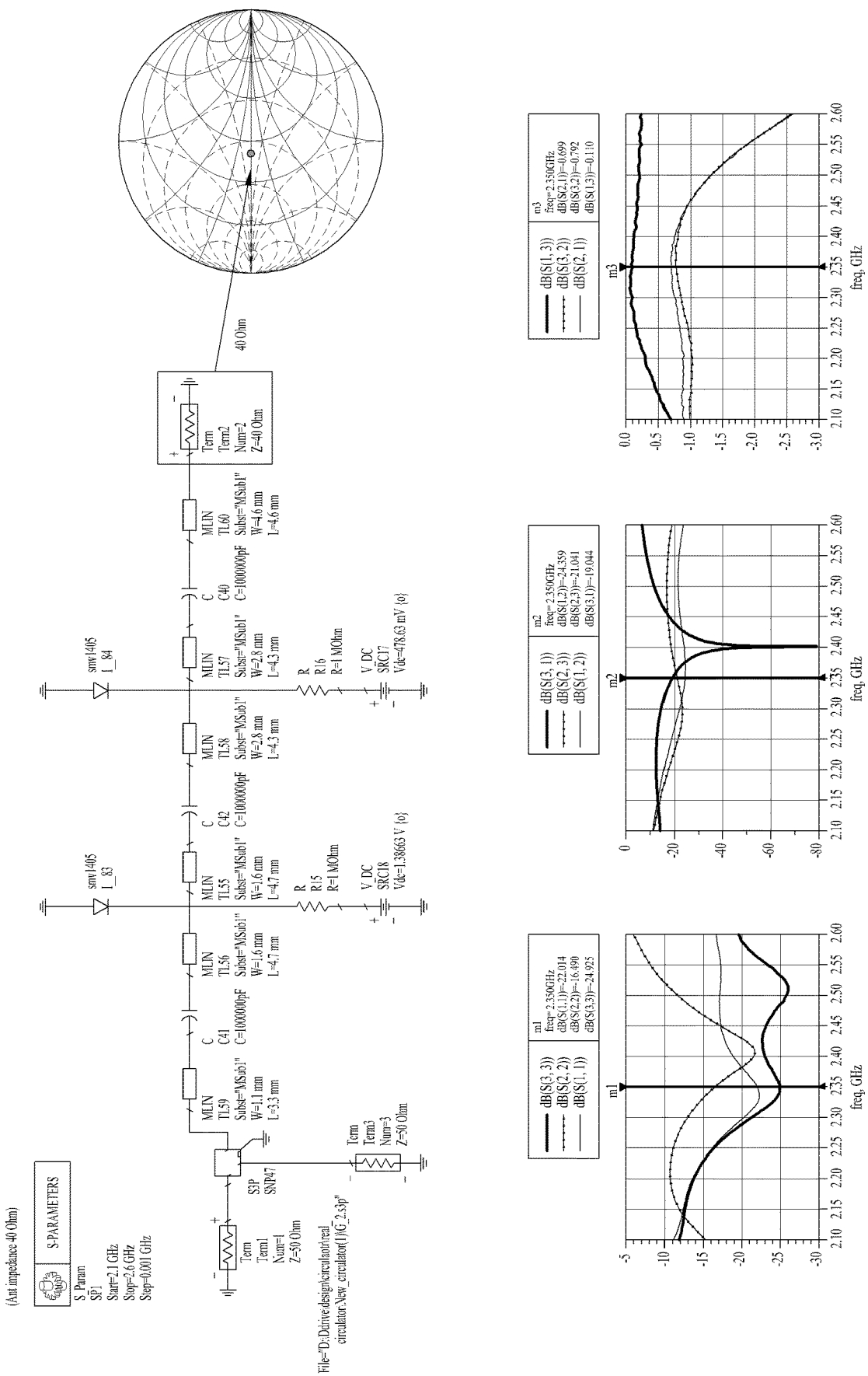
Figure 25:
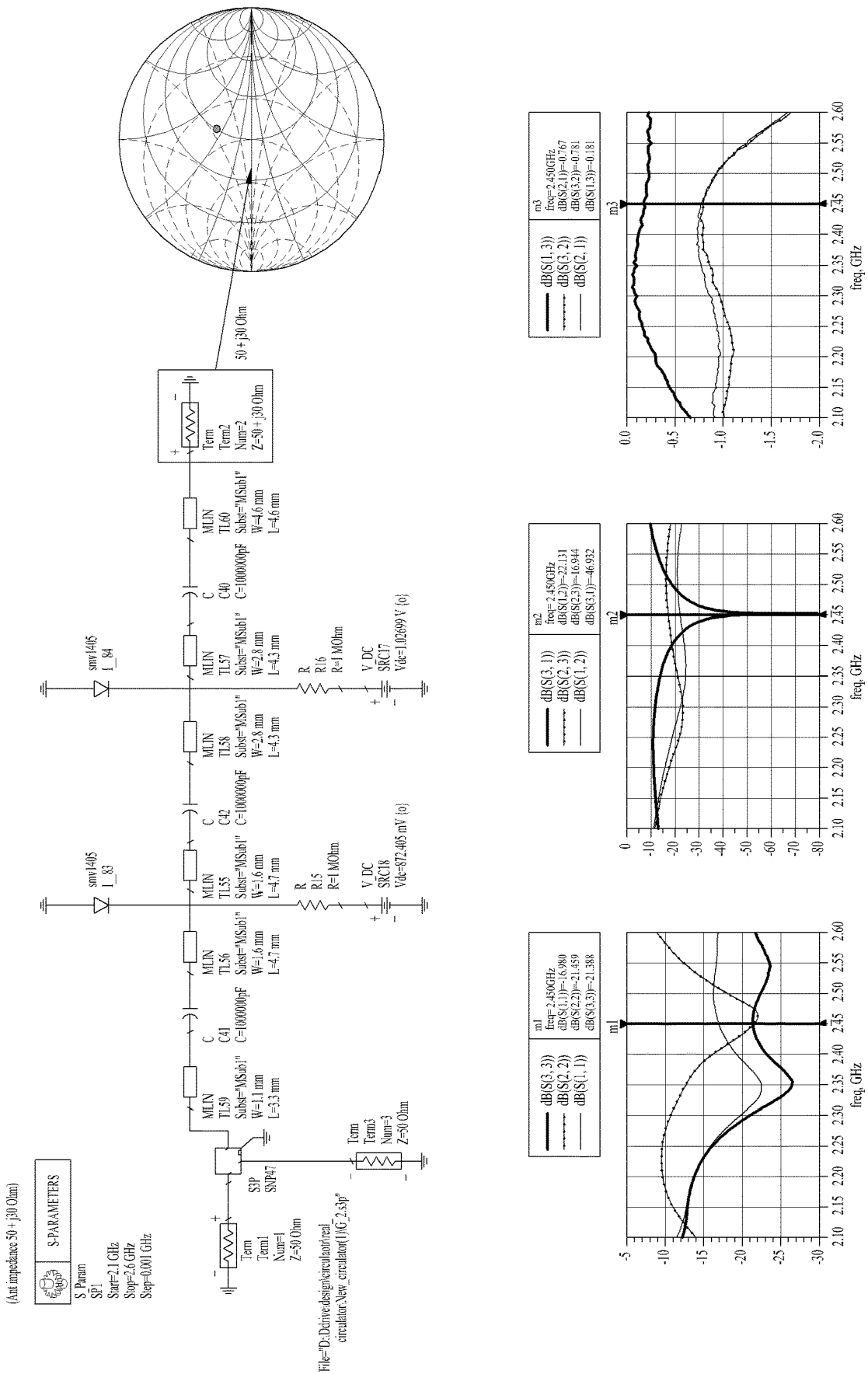
Figure 27:
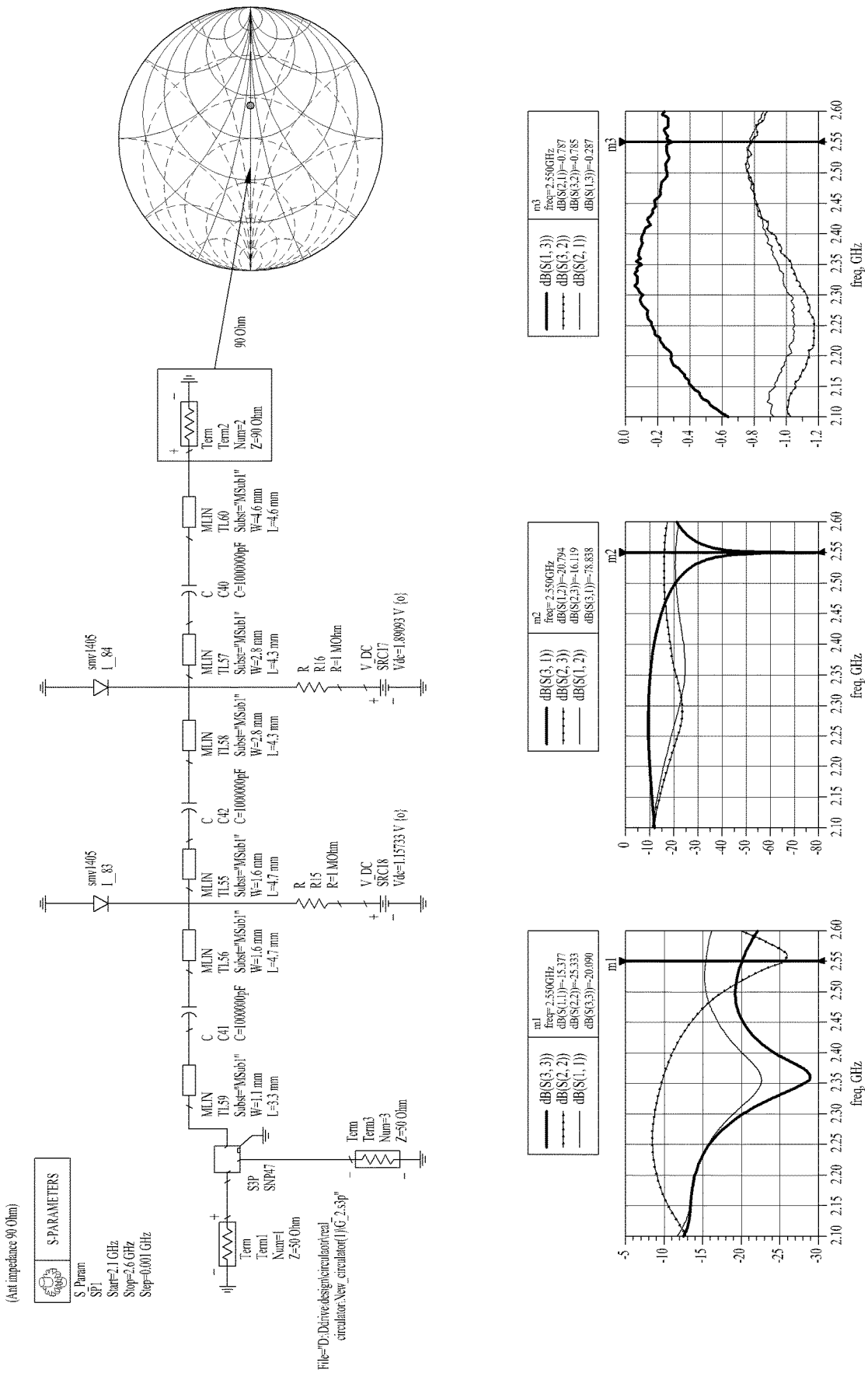
Figure 28:
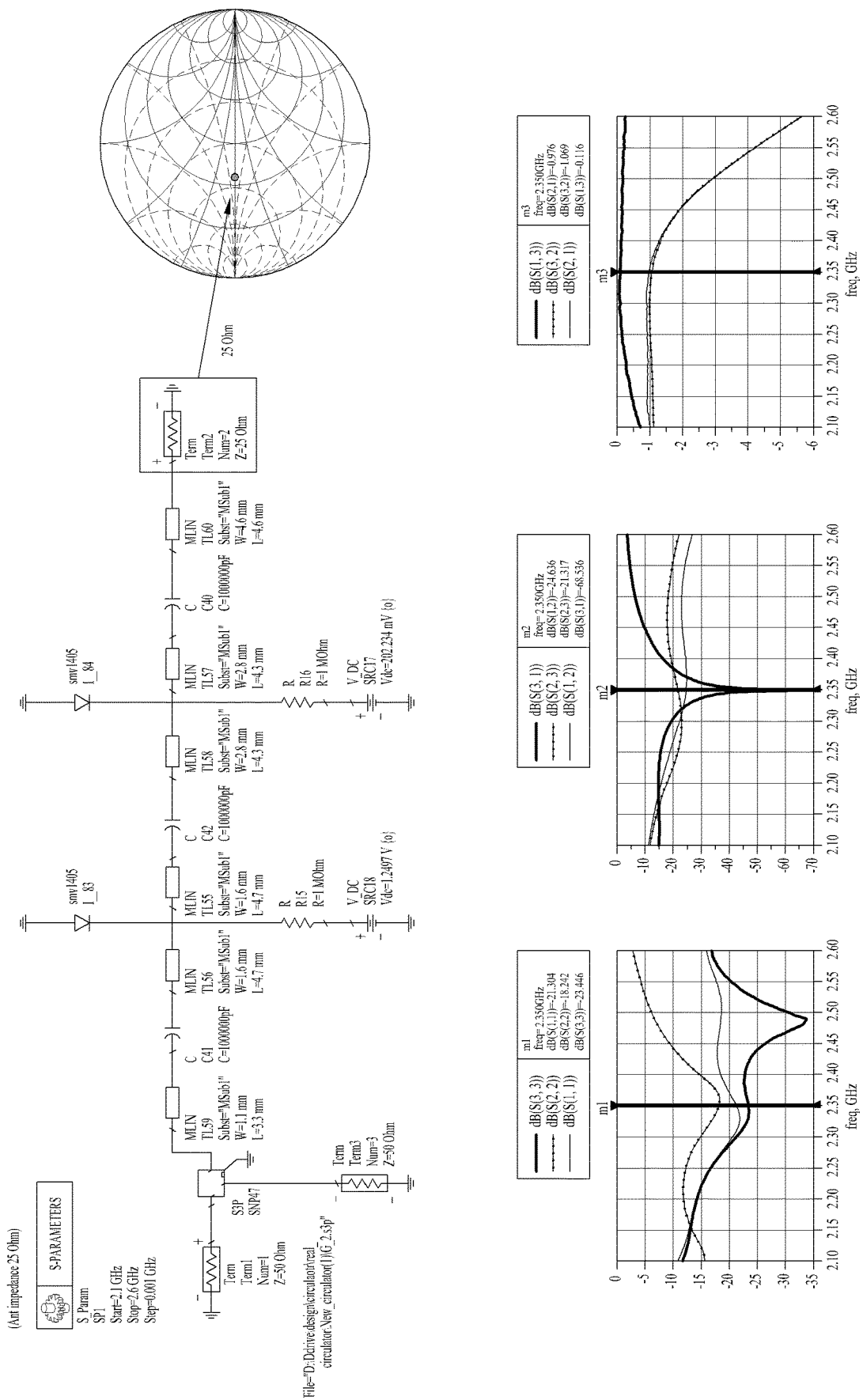
Figure 29:
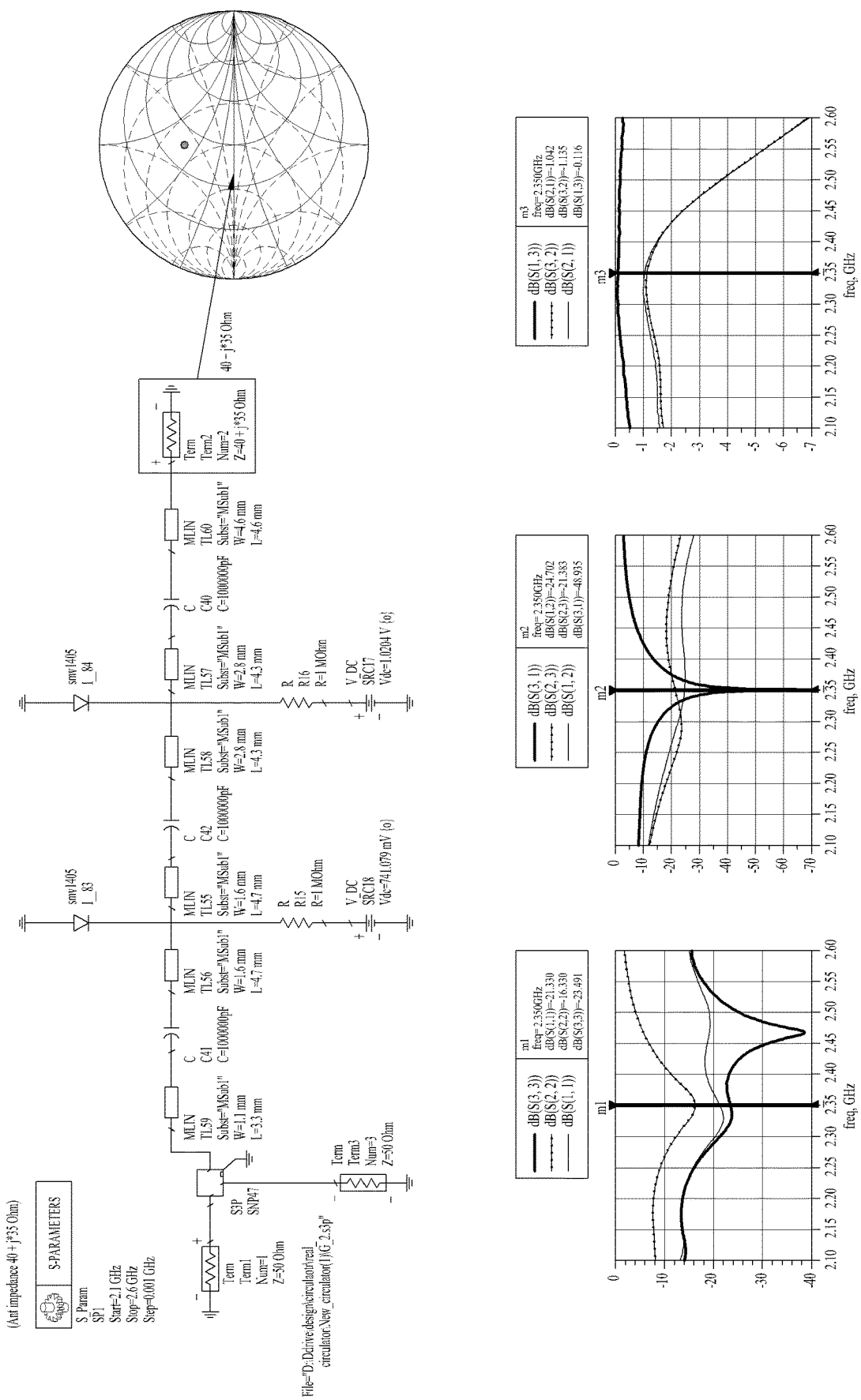
Figure 30:
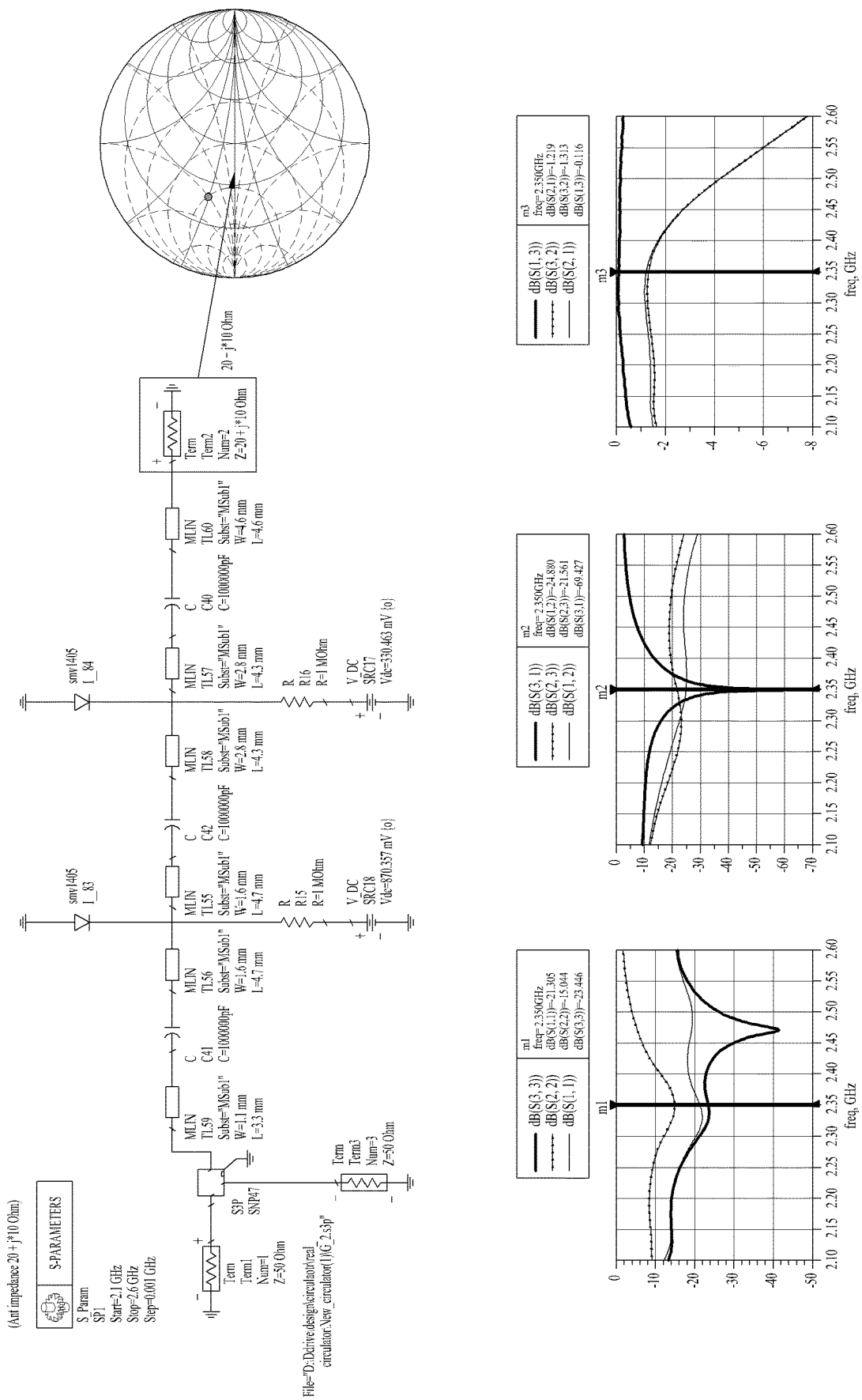
Figure 31:
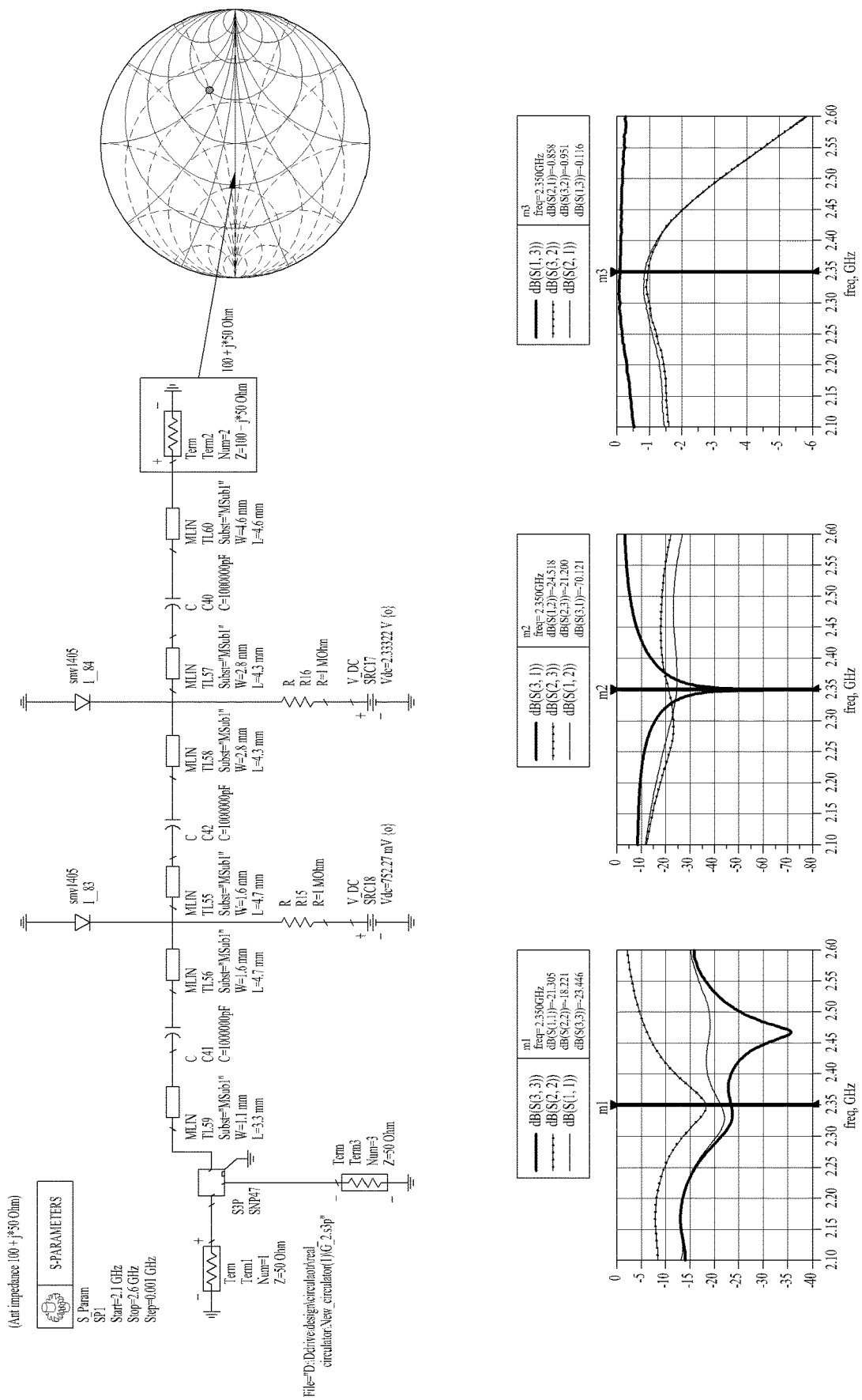

FIG. 19 is a view illustrating high isolation which is maintained even for the impedance of any antenna in a matching network of the present invention according to an embodiment of the present invention. To maintain high isolation for any antenna, conjugate matching should be achieved between the matching network and the impedance of the antenna. Thus, to demonstrate that the matching network proposed by the present invention maintains high isolation for any antenna, it is assumed that if a conjugate impedance value falls within a −10 dB circle, all antennas within the −10 dB circle may maintain high isolation. To verify the assumption, the −10 dB circle and conjugate impedance values are all plotted on the Smith chart. As a result, the conjugate impedance values cover the −10 dB circle. Thus, it may be noted that an antenna having an impedance of −10 dB also has high isolation.

Figure 32:
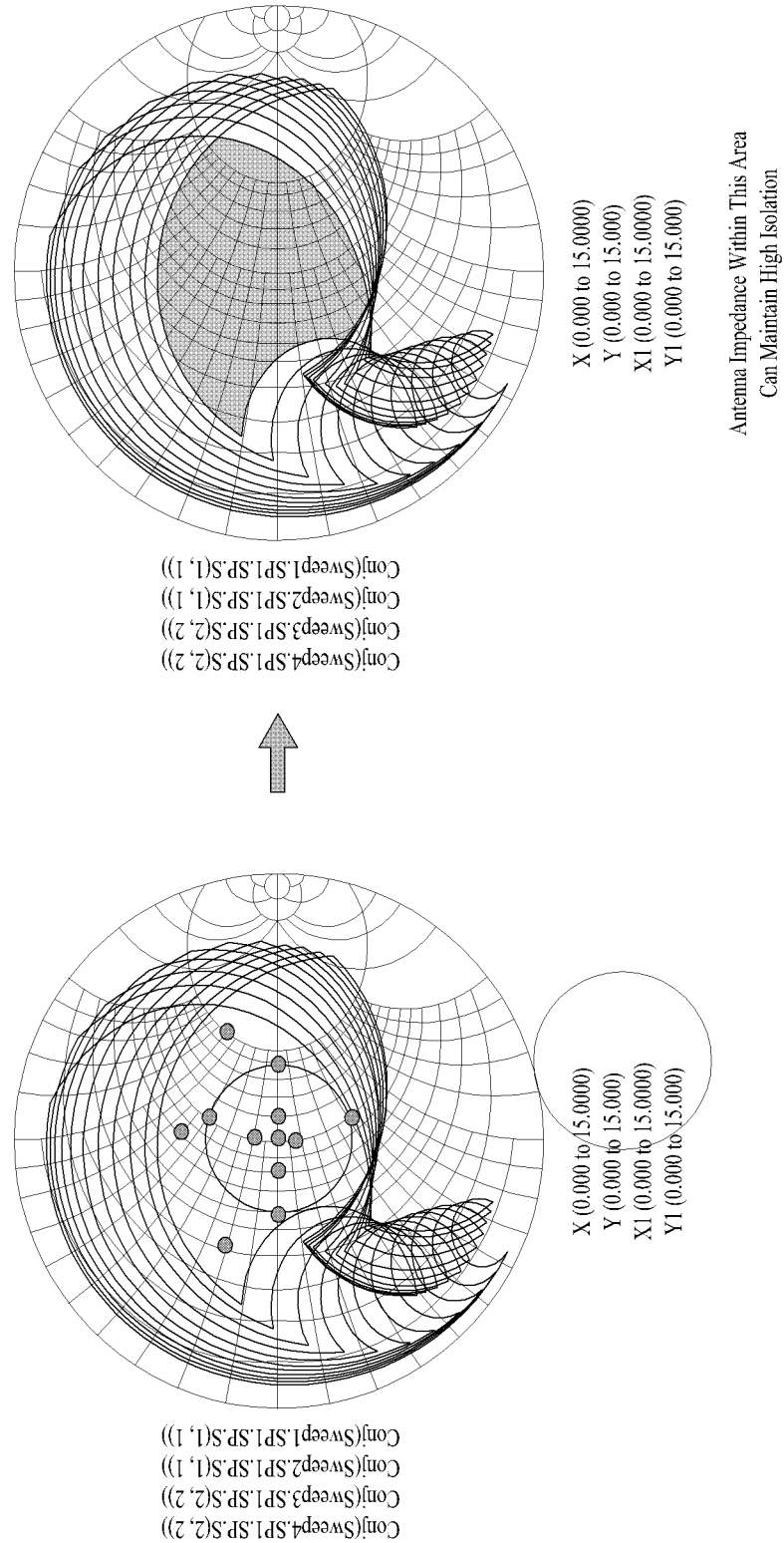
FIG. 32 is a view illustrating plotting of all impedance areas of any antennas illustrated in FIGS. 20 to 31 according to an embodiment of the present invention.

FIGS. 20 to 31 are views illustrating simulation results of FIG. 9 according to an embodiment of the present invention, and FIG. 32 is a view illustrating plotting of all impedance areas of any antennas illustrated in FIGS. 20 to 31 according to an embodiment of the present invention. As illustrated in FIGS. 20 to 32, the impedances of any antennas are set as dots within the −10 dB circle illustrated in FIG. 19 and then simulated. As a result, it is revealed that widths W and lengths L are same, while only a voltage varies.

The matching network system combined with a circulator and the method thereof as described above have the following effects.

First, the increase of the isolation performance of the circulator in a plurality of frequencies makes a great contribution to improvement of system performance related to a radar, a communication system, a full duplex system, and so on.

Secondly, the circulator is applicable to a conventional circulator, which obviates the need for purchasing a new circulator or processing. Thus, fabrication cost is decreased.

Thirdly, compared to a conventional scheme in which a ferrite material is changed, the circulator achieves high isolation only by use of a matching network and a Varactor diode, and is also applicable to various communication systems through frequency switching.

Fourthly, since the circulator is applicable to the conventional circulator, users are allowed to fabricate and use a circulator easily with low cost.

While the disclosure has been shown and described with reference to preferred embodiments with which to describe the technical spirit of the present invention, the present invention is not limited to the illustrated and described structures and operations, it will be understood by those skilled in the art that various changes and modifications may be made therein without departing from the spirit and scope of the present invention. Accordingly, the scope of the invention should be determined by the appended claims and their legal equivalents, not by the above description, and all changes coming within the meaning and equivalency range of the appended claims are intended to be embraced therein.

What is claimed is:

1. A matching network system combined with a circulator comprising:
   a reflection coefficient calculator configured to calculate a reflection coefficient per frequency, required to cancel a signal leaked (a leakage signal) from a port combined with an antenna (an antenna port);
   an impedance calculator configured to calculate an impedance value from the calculated reflection coefficient; and
   a matching unit configured to match the antenna by using a matching network circuit for changing an impedance value of the antenna to the calculated impedance value, whereby cancellation of the leakage signal is controlled.

2. The matching network system according to claim 1, wherein the reflection coefficient of the reflection coefficient calculator includes a magnitude value and a phase value of a reflected signal.

3. The matching network system according to claim 2, wherein the magnitude value of the reflected signal is calculated by a formula of calculating a magnitude of a reflected wave, expressed as [Equation 1]

$$|\Gamma| = \frac{mag(S31)}{mag(S21) \times mag(S32)} \quad \text{[Equation 1]}$$

where |Γ| represents the magnitude value of the reflected signal, mag(S21) represents a magnitude value of a signal traveling from an input port to the antenna port, mag(S31) represents a magnitude value of a leakage signal in the circulator, and mag(S32) represents a magnitude value of a signal traveling from the antenna port to an output port.

4. The matching network system according to claim 2, wherein the phase value of the reflected signal is calculated by a formula of calculating a phase of a reflected wave, expressed as [Equation 2]

$$\angle\Gamma = n\pi + \text{Phase}(S31) - \text{Phase}(S21) - \text{Phase}(S32) \quad \text{[Equation 2]}$$

where ∠Γ represents the phase value of the reflected signal, Phase(S31) represents a phase value of the leakage signal in the circulator, Phase(S21) represents a phase value of the signal traveling from the input port to the antenna port, Phase(S32) represents a phase value of the signal traveling from the antenna port to the output port, and n=1, 3, 5, 7 . . . .

5. The matching network system according to claim 2, wherein a voltage is controlled by using a Varactor diode further included in the matching network circuit so that a magnitude value and a phase value of the reflected signal are satisfied on each frequency.

6. A method of a matching network combined with a circulator, the method comprising:
   calculating a reflection coefficient per frequency, required to cancel a signal leaked (a leakage signal) from a port combined with an antenna (an antenna port) by a reflection coefficient calculator;

calculating an impedance value from the calculated reflection coefficient by an impedance calculator; and matching the antenna by using a matching network circuit for changing an impedance value of the antenna to the calculated impedance value by a matching unit, whereby cancellation of the leakage signal is controlled.

7. The method according to claim 6, wherein the reflection coefficient of the reflection coefficient calculator includes a magnitude value and a phase value of a reflected signal.

8. The method according to claim 7, wherein the magnitude value of the reflected signal is calculated by a formula of calculating a magnitude of a reflected wave, expressed as [Equation 1]

$$|\Gamma| = \frac{mag(S31)}{mag(S21) \times mag(S32)} \quad \text{[Equation 1]}$$

where $|\Gamma|$ represents the magnitude value of the reflected signal, mag(S21) represents a magnitude value of a signal traveling from an input port to the antenna port, mag(S31) represents a magnitude value of a leakage signal in the circulator, and mag(S32) represents a magnitude value of a signal traveling from the antenna port to an output port.

9. The method according to claim 7, wherein the phase value of the reflected signal is calculated by a formula of calculating a phase of a reflected wave, expressed as [Equation 2]

$$\angle\Gamma = n\pi + \text{Phase}(S31) - \text{Phase}(S21) - \text{Phase}(S32) \quad \text{[Equation 2]}$$

where $\angle\Gamma$ represents the phase value of the reflected signal, Phase(S31) represents a phase value of the leakage signal in the circulator, Phase(S21) represents a phase value of the signal traveling from the input port to the antenna port, Phase(S32) represents a phase value of the signal traveling from the antenna port to the output port, and n=1, 3, 5, 7 . . . .

10. The matching network system according to claim 7, wherein a voltage is controlled by using a Varactor diode further included in the matching network circuit so that a magnitude value and a phase value of the reflected signal are satisfied on each frequency.

* * * * *